United States Patent
Heo et al.

(10) Patent No.: US 11,848,212 B2
(45) Date of Patent: *Dec. 19, 2023

(54) ALTERNATING ETCH AND PASSIVATION PROCESS

(71) Applicant: Lam Research Corporation, Fremont, CA (US)

(72) Inventors: Seongjun Heo, Dublin, CA (US); Jengyi Yu, San Ramon, CA (US); Chen-Wei Liang, El Cerrito, CA (US); Alan J. Jensen, Mountain House, CA (US); Samantha S. H. Tan, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/056,468

(22) Filed: Nov. 17, 2022

(65) Prior Publication Data

US 2023/0197459 A1 Jun. 22, 2023

Related U.S. Application Data

(63) Continuation of application No. 17/596,921, filed as application No. PCT/US2020/038996 on Jun. 22, 2020, now Pat. No. 11,551,938.

(Continued)

(51) Int. Cl.
*H01L 21/3065* (2006.01)
*H01L 21/02* (2006.01)
(Continued)

(52) U.S. Cl.
CPC .... *H01L 21/30655* (2013.01); *H01L 21/0228* (2013.01); *H01L 21/0337* (2013.01); *H01L 21/67069* (2013.01)

(58) Field of Classification Search
None
See application file for complete search history.

(56) References Cited

U.S. PATENT DOCUMENTS

| | | |
|---|---|---|
| 4,544,444 A | 10/1985 | Chang |
| 4,708,766 A | 11/1987 | Hynecek |

(Continued)

FOREIGN PATENT DOCUMENTS

| | | |
|---|---|---|
| CN | 104752199 A | 7/2015 |
| DE | 4337309 A1 | 3/1995 |

(Continued)

OTHER PUBLICATIONS

Chinese First Office Action dated Jan. 6, 2020 issued in Application No. CN 201710498301.5.

(Continued)

*Primary Examiner* — Roberts P Culbert
(74) *Attorney, Agent, or Firm* — Weaver Austin Villeneuve & Sampson LLP

(57) ABSTRACT

Tin oxide films are used as spacers and hardmasks in semiconductor device manufacturing. In one method, tin oxide layer (e.g., spacer footing) needs to be selectively etched in a presence of an exposed silicon-containing layer, such as SiOC, SiON, SiONC, amorphous silicon, SiC, or SiN. In order to reduce damage to the silicon-containing layer the process involves passivating the silicon-containing layer towards a tin oxide etch chemistry, etching the tin oxide, and repeating passivation and etch in an alternating fashion. For example, passivation and etch can be each performed between 2-50 times. In one implementation, passivation is performed by treating the substrate with an oxygen-containing reactant, activated in a plasma, and the tin oxide etching is performed by a chlorine-based chemistry, such as using a mixture of $Cl_2$ and $BCl_3$.

14 Claims, 22 Drawing Sheets

Related U.S. Application Data

(60) Provisional application No. 62/867,797, filed on Jun. 27, 2019.

(51) Int. Cl.
*H01L 21/033* (2006.01)
*H01L 21/67* (2006.01)

(56) References Cited

U.S. PATENT DOCUMENTS

| | | |
|---|---|---|
| 4,778,562 A | 10/1988 | Chang |
| 4,878,993 A | 11/1989 | Rossi et al. |
| 5,032,221 A | 7/1991 | Roselle et al. |
| 5,079,178 A | 1/1992 | Chouan et al. |
| 5,171,401 A | 12/1992 | Roselle |
| 5,286,337 A | 2/1994 | Tsou |
| 5,318,664 A | 6/1994 | Saia et al. |
| 5,607,602 A | 3/1997 | Su et al. |
| 5,667,631 A | 9/1997 | Holland et al. |
| 5,723,366 A | 3/1998 | Suzuki et al. |
| 6,036,876 A | 3/2000 | Chen et al. |
| 6,180,438 B1 | 1/2001 | Deane et al. |
| 6,368,978 B1 | 4/2002 | Kumar et al. |
| 6,416,822 B1 | 7/2002 | Chiang et al. |
| 6,428,859 B1 | 8/2002 | Chiang et al. |
| 7,459,732 B2 | 12/2008 | Fleischer et al. |
| 8,163,094 B1 | 4/2012 | Greer et al. |
| 8,435,608 B1 | 5/2013 | Subramonium et al. |
| 8,747,964 B2 | 6/2014 | Park et al. |
| 8,901,016 B2 | 12/2014 | Ha et al. |
| 8,969,110 B2 | 3/2015 | Choi |
| 9,269,590 B2 | 2/2016 | Luere et al. |
| 9,287,113 B2 | 3/2016 | Kang et al. |
| 9,390,909 B2 | 7/2016 | Pasquale et al. |
| 9,437,443 B2 | 9/2016 | Brink et al. |
| 9,515,156 B2 | 12/2016 | Besser et al. |
| 9,523,148 B1 | 12/2016 | Pore et al. |
| 9,640,396 B2 | 5/2017 | Lin et al. |
| 9,824,893 B1 | 11/2017 | Smith et al. |
| 9,892,917 B2 | 2/2018 | Swaminathan et al. |
| 10,546,748 B2 | 1/2020 | Yu et al. |
| 10,665,501 B2 | 5/2020 | Rainville et al. |
| 11,031,245 B2 | 6/2021 | Smith et al. |
| 11,088,019 B2 | 8/2021 | Van Cleemput et al. |
| 11,183,383 B2 | 11/2021 | Smith et al. |
| 11,322,351 B2 | 5/2022 | Yu et al. |
| 11,355,353 B2 | 6/2022 | Yu et al. |
| 11,551,938 B2 | 1/2023 | Heo et al. |
| 11,637,037 B2 | 4/2023 | Van Cleemput et al. |
| 2001/0008227 A1 | 7/2001 | Sadamoto et al. |
| 2001/0018252 A1 | 8/2001 | Park et al. |
| 2001/0030860 A1 | 10/2001 | Kimura et al. |
| 2002/0044230 A1 | 4/2002 | Yamazaki et al. |
| 2002/0113271 A1 | 8/2002 | Noguchi et al. |
| 2002/0134425 A1 | 9/2002 | Yamamoto et al. |
| 2002/0185466 A1 | 12/2002 | Furuta et al. |
| 2003/0232504 A1 | 12/2003 | Eppler et al. |
| 2004/0033698 A1 | 2/2004 | Lee et al. |
| 2006/0072084 A1 | 4/2006 | Van Herpen et al. |
| 2006/0073706 A1 | 4/2006 | Li et al. |
| 2006/0148118 A1 | 7/2006 | Hsiung et al. |
| 2006/0175558 A1 | 8/2006 | Bakker et al. |
| 2006/0270209 A1 | 11/2006 | Mitsui et al. |
| 2007/0040999 A1 | 2/2007 | Wilhelmus Van Herpen et al. |
| 2007/0069160 A1 | 3/2007 | Banine et al. |
| 2008/0061030 A1 | 3/2008 | Liu et al. |
| 2008/0210660 A1 | 9/2008 | Stockum et al. |
| 2009/0011589 A1 | 1/2009 | Jeon et al. |
| 2009/0017616 A1 | 1/2009 | Grunow et al. |
| 2009/0145879 A1 | 6/2009 | Fairbairn et al. |
| 2009/0233425 A1 | 9/2009 | Furuno et al. |
| 2010/0099046 A1 | 4/2010 | Kim et al. |
| 2010/0120247 A1 | 5/2010 | Park |
| 2010/0159639 A1 | 6/2010 | Sakata |
| 2010/0195033 A1 | 8/2010 | Takayama et al. |
| 2011/0121378 A1 | 5/2011 | Ahn et al. |
| 2011/0198627 A1 | 8/2011 | Maindron et al. |
| 2011/0306214 A1 | 12/2011 | Zin |
| 2012/0115250 A1 | 5/2012 | Ariga et al. |
| 2012/0193632 A1 | 8/2012 | Toriumi |
| 2013/0161625 A1 | 6/2013 | Ku et al. |
| 2013/0309871 A1 | 11/2013 | DeVilliers |
| 2014/0060574 A1 | 3/2014 | Wyse et al. |
| 2014/0167040 A1 | 6/2014 | Lee et al. |
| 2014/0308812 A1 | 10/2014 | Arghavani et al. |
| 2014/0367833 A1 | 12/2014 | Brink et al. |
| 2015/0000737 A1 | 1/2015 | Miyake et al. |
| 2015/0126042 A1 | 5/2015 | Pasquale et al. |
| 2015/0140726 A1 | 5/2015 | Honda et al. |
| 2015/0162416 A1 | 6/2015 | Chang et al. |
| 2015/0179414 A1 | 6/2015 | Xiao et al. |
| 2015/0221541 A1 | 8/2015 | Nemani et al. |
| 2015/0243661 A1 | 8/2015 | Matsumoto |
| 2015/0247238 A1 | 9/2015 | Pasquale et al. |
| 2015/0287612 A1 | 10/2015 | Luere et al. |
| 2015/0318181 A1 | 11/2015 | Cantone et al. |
| 2016/0111374 A1 | 4/2016 | Brink et al. |
| 2016/0111515 A1 | 4/2016 | Besser et al. |
| 2016/0195812 A1 | 7/2016 | Huang et al. |
| 2016/0203982 A1 | 7/2016 | Lin et al. |
| 2016/0293405 A1 | 10/2016 | Matsumoto et al. |
| 2016/0293418 A1 | 10/2016 | Pasquale et al. |
| 2016/0293437 A1 | 10/2016 | Zhou et al. |
| 2016/0293438 A1 | 10/2016 | Zhou et al. |
| 2016/0314985 A1 | 10/2016 | Yang et al. |
| 2016/0329207 A1 | 11/2016 | Mohanty et al. |
| 2016/0336178 A1 | 11/2016 | Swaminathan et al. |
| 2016/0379842 A1 | 12/2016 | Kal et al. |
| 2017/0301552 A1 | 10/2017 | Devilliers |
| 2018/0012759 A1 | 1/2018 | Smith et al. |
| 2018/0090335 A1 | 3/2018 | Karve et al. |
| 2018/0204731 A1 | 7/2018 | Zhang et al. |
| 2018/0233398 A1 | 8/2018 | Van Cleemput et al. |
| 2018/0240667 A1 | 8/2018 | Yu et al. |
| 2018/0277661 A1 | 9/2018 | Nagayama et al. |
| 2019/0157084 A1 | 5/2019 | Huang et al. |
| 2019/0237341 A1 | 8/2019 | Yu et al. |
| 2019/0312147 A1 | 10/2019 | Lee et al. |
| 2019/0390341 A1 | 12/2019 | Singhal et al. |
| 2020/0006082 A1 | 1/2020 | Su |
| 2020/0051807 A1 | 2/2020 | Singhal et al. |
| 2020/0083044 A1 | 3/2020 | Yu et al. |
| 2020/0199751 A1 | 6/2020 | Singhal et al. |
| 2020/0219725 A1 | 7/2020 | Smith et al. |
| 2020/0219758 A1 | 7/2020 | Van Cleemput et al. |
| 2021/0017643 A1 | 1/2021 | Kanakasabapathy et al. |
| 2021/0242019 A1 | 8/2021 | Smith et al. |
| 2021/0265163 A1 | 8/2021 | Yu et al. |
| 2021/0265173 A1 | 8/2021 | Yu et al. |
| 2021/0343579 A1 | 11/2021 | Van Cleemput et al. |
| 2022/0005694 A1 | 1/2022 | Smith et al. |
| 2022/0021099 A1 | 1/2022 | Shrivastava et al. |
| 2022/0165571 A1 | 5/2022 | Yu et al. |
| 2022/0208551 A1 | 6/2022 | Heo et al. |
| 2022/0270877 A1 | 8/2022 | Yu et al. |
| 2023/0227970 A1 | 7/2023 | Ha et al. |

FOREIGN PATENT DOCUMENTS

| | | |
|---|---|---|
| EP | RD301101 A | 5/1989 |
| JP | S62136579 A | 6/1987 |
| JP | S62179774 A | 8/1987 |
| JP | S6425420 A | 1/1989 |
| JP | H01259184 A | 10/1989 |
| JP | H0298007 A | 4/1990 |
| JP | H0377209 A | 4/1991 |
| JP | H03136249 A | 6/1991 |
| JP | H04506888 A | 11/1992 |
| JP | H05267701 A | 10/1993 |
| JP | H09120967 A | 5/1997 |
| JP | 2644758 B2 | 8/1997 |
| JP | 2003068155 A | 3/2003 |
| JP | 2007208076 A | 8/2007 |
| JP | 2013179127 A | 9/2013 |

(56) References Cited

FOREIGN PATENT DOCUMENTS

| | | |
|---|---|---|
| JP | 2014086500 A | 5/2014 |
| JP | 2015111668 A | 6/2015 |
| JP | 2015122497 A | 7/2015 |
| JP | 2018006742 A | 1/2018 |
| KR | 950012151 A | 5/1995 |
| KR | 19990023468 A | 3/1999 |
| KR | 20030007457 A | 1/2003 |
| KR | 20040016779 A | 2/2004 |
| KR | 20070076721 A | 7/2007 |
| KR | 20090022667 A | 3/2009 |
| KR | 20120024616 A | 3/2012 |
| KR | 20120125102 A | 11/2012 |
| KR | 20150053253 A | 5/2015 |
| KR | 20170141673 A | 12/2017 |
| KR | 20180002026 A | 1/2018 |
| RU | 2053584 C1 | 1/1996 |
| TW | 134077 | 5/1990 |
| TW | 538137 B | 6/2003 |
| TW | 200531080 A | 9/2005 |
| TW | 200938660 A | 9/2009 |
| TW | 201027593 A | 7/2010 |
| TW | 201410914 A | 3/2014 |
| TW | 201427084 A | 7/2014 |
| TW | 201546314 A | 12/2015 |
| WO | WO-2010134176 A1 | 11/2010 |
| WO | WO-2019216092 A1 | 11/2019 |

OTHER PUBLICATIONS

Chinese Second Office Action dated Jun. 15, 2020 issued in Application No. CN 201710498301.5.
Choi W.S., "The Fabrication of Tin Oxide Films by Atomic Layer Deposition using Tetrakis(Ethylmethylamino) Tin Precursor," Transactions on Electrical and Electronic Materials, Dec. 2009, vol. 10(6), pp. 200-202.
CN Office Action dated Mar. 27, 2023, in Application No. CN201880023914.6 with English translation.
CN Office Action dated Mar. 29, 2023, in Application No. CN201810148464.5 with English translation.
Du X., et al., "In Situ Examination of Tin Oxide Atomic Layer Deposition Using Quartz Crystal Microbalance and Fourier Transform Infrared Techniques," Journal of Vacuum Science & Technology, 2005, vol. 23(4), pp. 581-588.
Elam J.W., et al., "Atomic Layer Deposition of Indium Tin Oxide Thin Films Using Nonhalogenated Precursors," Journal of Physical Chemistry C, 2008, vol. 112(6), pp. 1938-1945.
Elam, J.W., et al., "Atomic Layer Deposition of Tin Oxide Films using Tetrakis(Dimethylamino) Tin," Journal of Vacuum Science & Technology, 2008, vol. 26, No. 2, pp. 244-252.
Gordon R.G., et al., "Low-Temperature Atmospheric Pressure Chemical Vapor Deposition of Polycrystalline Tin Nitride Thin Films," Chemistry of Materials, 1992, vol. 4, pp. 68-71.
Heo J., et al., "Atomic Layer Deposition of Tin Oxide with Nitric Oxide as an Oxidant Gas," Journals of Materials Chemistry, 2012, vol. 22, pp. 4599-4602.
Heo, J. et al., "Low Temperature Atomic Layer Deposition of Tin Oxide," Chemistry of Materials, 2010, vol. 22, No. 17, pp. 4964-4973.
International Preliminary Report and Patentability (ISA/KR) dated Oct. 1, 2020 issued in Application No. PCT/US2019/022319.
International Preliminary Report on Patentability dated Aug. 13, 2020 issued in Application No. PCT/US2019/015559.
International Preliminary Report on Patentability dated Aug. 29, 2019 issued in Application No. PCT/US2018/018019.
International Preliminary Report on Patentability dated Dec. 29, 2022, in PCT Application No. PCT/US2021/036763.
International Preliminary Report on Patentability dated Feb. 2, 2023, in PCT Application No. PCT/US2021/042626.
International Preliminary Report on Patentability dated Jan. 6, 2022 in PCT Application No. PCT/US2020/038996.
International Search Report and Written Opinion dated Nov. 11, 2021, in PCT Application No. PCT/US2021/042626.
International Search Report and Written Opinion dated Oct. 1, 2021, in PCT Application No. PCT/US2021/036763.
International Search Report and Written Opinion dated Oct. 5, 2020, in application No. PCT/US2020/038996.
International Search Report and Written Opinion (ISA/KR) dated Jul. 3, 2019 issued in Application No. PCT/US2019/022319.
International Search Report and Written Opinion (ISA/KR) dated Jun. 27, 2018 issued in Application No. PCT/US18/18019.
International Search Report and Written Opinion (ISA/KR) dated May 17, 2019 issued in Application No. PCT/US2019/015559.
Japanese First Office Action dated Aug. 3, 2021 issued in Application No. JP 2017-120945.
Japanese Journal of Applied Physics, vol. 27, No. 9, Sep. 1988, T. Minami et al.: "Reactive ion etching of transparent conducting tin oxide films using electron cyclotron resonance hydrogen plasma", pp. L 1753-L 1756 (Year: 1988).
JP Office Action dated Nov. 1, 2022, in Application No. JP2019-543306 with English translation.
JP Office Action dated Feb. 1, 2022, in Application No. JP2018-021500 with English translation.
JP Office Action dated Jan. 24, 2023 in Application No. JP2020-540611 with English translation.
JP Office Action dated Mar. 29, 2022, in Application No. JP2019-543306 with English translation.
JP Office Action dated May 10, 2022, in Application No. JP2017-120945 with English translation.
Korean First Office Action dated Aug. 18, 2021 issued in Application No. KR 10-2017-0077686.
Korean First Office Action dated Jul. 30, 2021 issued in Application No. KR 10-2021-7017077.
KR Office Action dated Aug. 30, 2022 in Application No. KR10-2020-7024840 With English translation.
KR Office Action dated Jul. 18, 2022 in Application No. KR10-2021-7017077 With English translation.
KR Office Action dated Jun. 8, 2022, in Application No. KR1020200034960 with English translation.
KR Office action dated Apr. 20, 2022, in Application No. KR10-2019-7026772 with English translation.
KR Office Action dated Aug. 18, 2021, in application No. KR1020200034960.
KR Office Action dated Feb. 17, 2022, in Application No. KR10-2021-7017077 with English translation.
KR Office Action dated Jan. 30, 2023 in Application No. KR10-2019-7026772 with English translation.
KR Office Action dated Mar. 29, 2022, in Application No. KR1020170077686 with English translation.
KR Office Action dated Mar. 29, 2022, in Application No. KR1020200034960 with English translation.
KR Office Action dated Mar. 30, 2023, in Application No. KR10-2020-7024840 With English translation.
KR Office Action dated May 14, 2023, in Application No. KR10-2021-7017290 with English translation.
KR Office Action dated Nov. 20, 2022, in Application No. KR10-2018-0014921 with English translation.
KR Office Action dated Nov. 20, 2022, in Application No. KR10-2020-0034961 with English translation.
Kwon K.H., et al., "Etch Mechanism of $In_2O_3$ and $SnO_2$ Thin Films in HBr-Based Inductively Coupled Plasmas," Journal of Vacuum Science and Technology A, 2010, vol. 28(2), pp. 226-231.
Li X., et al., "Tin Oxide with Controlled Morphology and Crystallinity by Atomic Layer Deposition onto Graphene Nanosheets for Enhanced Lithium Storage," Advanced Function Materials, 2012, vol. 22, pp. 1647-1654.
Mohri M., et al., "Plasma Etching of ITO Thin Films Using a CH4/H2 Gas Mixture," Japanese Journal of Applied Physics, 1990, vol. 29(10), pp. 1932-1935.
Mullings M.N., et al., "Tin Oxide Atomic Layer Deposition from Tetrakis(Dimethylamino) Tin and Water," Journal of Vacuum Science & Technology A, 2013, vol. 31(6), 8 pages.
Notice of Allowance dated Nov. 16, 2021, in U.S. Appl. No. 16/687,142.

(56) References Cited

OTHER PUBLICATIONS

Notice of Allowance dated Oct. 27, 2021, in U.S. Appl. No. 16/825,514.
Taiwanese First Office Action dated Dec. 2, 2020 issued in Application No. TW 106121182.
Taiwanese First Office Action dated Jun. 17, 2021 issued in Application No. TW 107104861.
Taiwanese Second Office Action dated Jul. 20, 2021 issued in Application No. TW 106121182.
TW Office Action dated Dec. 30, 2021, in application No. 110121421 with English translation.
TW Office Action dated Nov. 17, 2022, in Application No. TW107104861 with English Translation.
TW Office Action dated Apr. 27, 2022, in Application No. TW107105182 with English translation.
TW Office Action dated Aug. 27, 2021, in Application No. TW110121421 with English translation.
TW Office Action dated Mar. 2, 2023, in Application No. 110121421 with English translation.
TW Office Action dated Mar. 2, 2023, in Application No. TW107105182 with English translation.
TW Office Action dated Mar. 20, 2023, in Application No. TW107105182 with English translation.
TW Office Action dated Sep. 23, 2022 In Application No. TW111123354 with English translation.
TW Office Action dated Sep. 7, 2021, in TW Application No. TW107105182 with English translation.
TW Rejection Decision dated Oct. 21, 2021, in application No. TW107104861 with English translation.
U.S. Corrected Notice of Allowability dated Dec. 1, 2021, in U.S. Appl. No. 16/687,142.
U.S. Corrected Notice of Allowance dated Feb. 16, 2022 in U.S. Appl. No. 16/260,764.
U.S. Corrected Notice of Allowance dated Feb. 22, 2022 in U.S. Appl. No. 16/687,142.
U.S. Corrected Notice of Allowance dated Mar. 17, 2022 in U.S. Appl. No. 16/687,142.
U.S. Corrected Notice of Allowance dated May 6, 2022 in U.S. Appl. No. 16/260,764.
U.S. Corrected Notice of Allowance dated Nov. 25, 2022 in U.S. Appl. No. 17/596,921.
U.S. Final Office Action, dated Apr. 16, 2020, issued in U.S. Appl. No. 15/713,377.
U.S. Final Office Action, dated Dec. 15, 2020, issued in U.S. Appl. No. 15/893,458.
U.S. Final Office Action, dated Dec. 7, 2020 issued in U.S. Appl. No. 16/260,764.
U.S. Final Office Action dated Feb. 17, 2022 in U.S. Appl. No. 16/825,473.
U.S. Final Office Action, dated Mar. 19, 2020, issued in U.S. Appl. No. 15/893,458.
U.S. Non Final Office Action dated Aug. 15, 2022 in U.S. Appl. No. 17/302,044.
U.S. Non-Final Office Action dated Feb. 13, 2023 in U.S. Appl. No. 17/302,847.
U.S. Notice of Allowance dated Apr. 2, 2021 issued in U.S. Appl. No. 15/893,458.
U.S. Notice of Allowance dated Apr. 4, 2022, in U.S. Appl. No. 16/687,142.
U.S. Notice of Allowance, dated Aug. 21, 2019, issued in U.S. Appl. No. 15/894,635.
U.S. Notice of Allowance dated Aug. 23, 2022 in U.S. Appl. No. 17/596,921.
U.S. Notice of Allowance dated Dec. 14, 2022 in U.S. Appl. No. 16/825,473.
U.S. Notice of Allowance dated Feb. 2, 2022 in U.S. Appl. No. 16/260,764.
U.S. Notice of Allowance dated Feb. 27, 2023 in U.S. Appl. No. 16/825,473.
U.S. Notice of Allowance dated Jan. 26, 2021 issued in U.S. Appl. No. 15/713,377.
U.S. Notice of Allowance dated Jun. 5, 2023, in U.S. Appl. No. 17/302,044.
U.S. Notice of Allowance dated Jun. 23, 2021 issued in U.S. Appl. No. 16/825,514.
U.S. Notice of Allowance, dated Jun. 26, 2017, issued in U.S. Appl. No. 15/195,348.
U.S. Notice of Allowance dated Mar. 16, 2023 in U.S. Appl. No. 16/825,473.
U.S. Notice of Allowance dated May 11, 2022, in U.S. Appl. No. 17/596,921.
U.S. Office Action, dated Apr. 11, 2019, issued in U.S. Appl. No. 15/894,635.
U.S. Office Action, dated Aug. 3, 2020, issued in U.S. Appl. No. 15/893,458.
U.S. Office Action, dated Dec. 26, 2019, issued in U.S. Appl. No. 15/713,377.
U.S. Office Action, dated Feb. 9, 2017, issued in U.S. Appl. No. 15/195,348.
U.S. Office Action dated Jun. 24, 2021 issued in U.S. Appl. No. 16/825,473.
U.S. Office Action, dated Jun. 25, 2020, issued in U.S. Appl. No. 16/260,764.
U.S. Office Action, dated Mar. 30, 2021, issued in U.S. Appl. No. 16/687,142.
U.S. Office Action dated Oct. 22, 2021 issued in U.S. Appl. No. 16/825,473.
U.S. Office Action, dated Sep. 13, 2019, issued in U.S. Appl. No. 15/893,458.
U.S. Office Action, dated Sep. 14, 2020, issued in U.S. Appl. No. 15/713,377.
U.S. Office Action, dated Sep. 27, 2021 issued in U.S. Appl. No. 16/260,764.
U.S. Office Action Interview Summary, dated Mar. 11, 2021, issued in U.S. Appl. No. 15/893,458.
U.S. Appl. No. 18/002,627, inventors Singhal et al., field Dec. 20, 2022.
U.S. Restriction Requirement dated Apr. 14, 2023 in U.S. Appl. No. 17/302,850.
U.S. Restriction Requirement dated Mar. 17, 2022, in U.S. Appl. No. 17/302,044.
U.S. Restriction requirement dated May 25, 2023, in U.S. Appl. No. 17/650,550.
U.S. Supplemental Notice of Allowance dated Dec. 22, 2022 in U.S. Appl. No. 16/825,473.
Wolf S., et al., "Silicon Processing for the VLSI Era," Process Technology, 1986, vol. 1, 16 pages.
Wu B.R., et al., "Texture-Etched $SnO_2$ Glasses Applied to Silicon Thin-Film Solar Cells," Journal of Nanomaterials, 2014, vol. 2014, 9 pages.

ALTERNATING ETCH AND PASSIVATION PROCESS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

FIELD OF THE INVENTION

This invention pertains to methods of semiconductor device manufacturing. Specifically, embodiments of this invention pertain to methods of using tin oxide films in semiconductor processing.

BACKGROUND

In integrated circuit (IC) fabrication, deposition and etching techniques are used for forming patterns of materials, such as for forming metal lines embedded in dielectric layers. Some patterning schemes involve the use of spacers that enable precise patterning and formation of small-scale features. Spacers are formed on a substrate, such that they are separated by defined distances (typically determined by previous patterning), and are used as masks for patterning of underlying layers. The materials of spacers and of surrounding layers are selected to have appropriate etch selectivity that would enable both formation of spacers, and patterning of underlying layers. After the patterning is completed, the spacers are removed by etching, and are not part of the final fabricated semiconductor device.

Spacers are used for patterning in a variety of applications, including formation of dynamic random-access memory (DRAM), patterning fins in fin field effect transistors (finFETs), and in back end of line (BEOL) processing.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In one aspect, a method of processing a semiconductor substrate is provided, where the method includes: (a) providing a semiconductor substrate having a plurality of protruding features over a silicon-containing layer, wherein the semiconductor substrate comprises an exposed tin oxide and an exposed silicon-containing material of the silicon-containing layer; (b) passivating the exposed silicon-containing material towards a tin oxide etch chemistry; (c) etching the exposed tin oxide using the tin oxide etch chemistry; and (d) repeating operations (b) and (c) such that operations (b) and (c) are performed in an alternating fashion. Using this method, a tin oxide footing near protruding features can be reduced without causing damage to the silicon-containing layer.

In some embodiments the silicon-containing material is at least one of amorphous silicon, silicon oxide, SiON, SiOC, SiONC, SiC, and SiN. Etching tin oxide in (c), in one embodiment includes using chlorine-based etch chemistry and exposing the semiconductor substrate to a plasma-activated chlorine-containing reactant selected from the group consisting of $Cl_2$, $BCl_3$, and combinations thereof. In some implementations, plasma is formed in a process gas that includes a chlorine-containing reactant selected from the group consisting of $Cl_2$, $BCl_3$, and combinations thereof, and a diluent gas selected from the group consisting from helium, neon, argon, and xenon and combinations thereof.

In one embodiment, etching tin oxide in (c) includes etching the tin oxide using a hydrogen-based etch chemistry that results in a formation of a tin hydride. For example, etching the tin oxide using a hydrogen-based etch chemistry can be performed by contacting the semiconductor substrate with a plasma-activated hydrogen-containing reactant selected from the group consisting of $H_2$, HBr, $NH_3$, $H_2O$, a hydrocarbon, and combinations thereof.

In some embodiments, the passivation of the silicon-containing layer is performed by treating the substrate with an oxygen-containing reactant. For example, silicon-containing layer may be passivated by treating the substrate with a plasma-activated oxygen-containing reactant. In specific embodiments, plasma formed in a process gas comprising a gas selected from the group consisting of $O_2$, $O_3$, $SO_2$, and $CO_2$.

In some embodiments, passivation step (b) is performed before etch step (c). In some embodiments, etch step (c) is performed before passivation step (b). In some embodiments steps (b) and (c) are performed between 2-50 times.

In some embodiments, the protruding features include horizontal surfaces and sidewalls and the method reduces a tin oxide footing at the sidewalls of the protruding features.

In one implementation, the silicon-containing material is selected from the group consisting of amorphous silicon, silicon oxide, SiON, SiOC, SiONC, SiC, and SiN, the passivating in (b) includes treating the substrate with a plasma-activated oxygen-containing reactant, and etching in (c) includes etching the tin oxide using a chlorine-based etch chemistry that comprises exposing the semiconductor substrate to a plasma-activated chlorine-containing reactant selected from the group consisting of $Cl_2$, $BCl_3$, and combinations thereof.

In some embodiments passivation in (b) includes treating the semiconductor substrate with a nitrogen-containing reactant.

In some embodiments, the method further includes: applying the photoresist to the semiconductor substrate; exposing the photoresist to light; patterning the photoresist and transferring the pattern to the semiconductor substrate; and selectively removing the photoresist from the semiconductor substrate.

In another aspect, an apparatus for processing a semiconductor substrate is provided where, the apparatus includes: (a) a processing chamber having a support for the semiconductor substrate and an inlet for introduction of one or more reactants into the processing chamber; and (b) a controller comprising program instructions for: (i) causing passivation a silicon-containing layer on a semiconductor substrate towards a tin oxide etch chemistry; (ii) causing etching of a tin oxide on a semiconductor substrate; and (iii) causing a repeating, in an alternating fashion of (i) and (ii). In some embodiments (i) includes causing treatment of the semiconductor substrate with a plasma-activated oxygen-containing reactant (e.g., plasma-activated $O_2$). In some embodiments (ii) includes causing etching of the tin oxide using a chlorine-based chemistry. In some embodiments (ii) includes causing etching of the tin oxide using a hydrogen-based chemistry. In some embodiments the program instructions include instructions for performing (i) and (ii) in an alternating fashion between 2-50 times.

In another aspect an apparatus is provided, where the apparatus includes a process chamber and a controller having program instructions for causing any of the methods provided herein.

In another aspect, non-transitory computer readable medium is provided containing code configured for performing any of the methods described herein.

These and other aspects of implementations of the subject matter described in this specification are set forth in the accompanying drawings and the description below.

DETAILED DESCRIPTION OF THE PREFERRED EMBODIMENTS

Figure 1A:
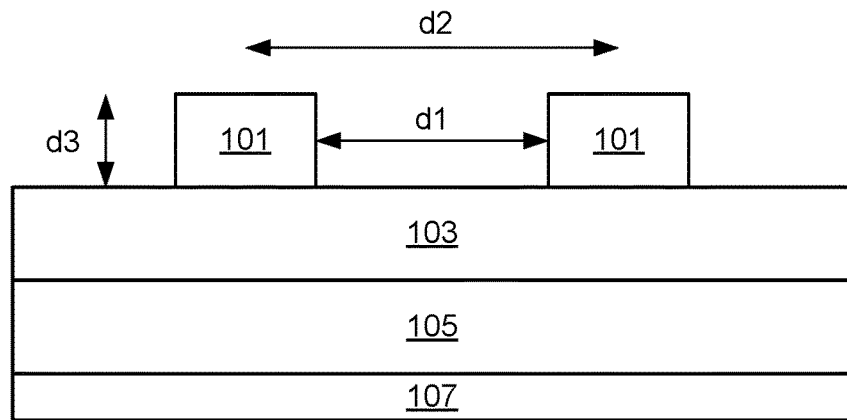
FIGS. 1A-1F show schematic cross-sectional views of a semiconductor substrate undergoing processing that involves spacer formation.

Methods that employ tin oxide films in semiconductor device manufacturing are provided. The methods utilize a number of etching processes with tunable etch rates and selectivities that allow integration of tin oxide films into process schemes that employ a wide variety of materials, such as silicon-containing compounds (e.g., silicon oxide ($SiO_2$), silicon carbide (SiC), silicon nitride (SiN), silicon oxycarbide (SiOC), silicon oxynitride (SiNO), silicon oxycarbonitride (SiCNO), and silicon carbonitride (SiCN)), elemental silicon (Si), carbon (including amorphous carbon and diamond-like carbon), photoresist, carbon-containing compounds (e.g., organic polymers, metal carbides, tungsten-containing carbon), metals (e.g., tungsten), metal oxides (e.g., titanium oxide, hafnium oxide, zirconium oxide, tantalum oxide), and metal nitrides (e.g., tantalum nitride (TaN) and titanium nitride (TiN)). In some embodiments tin oxide is etched in a presence of any of these materials with an etch selectivity of at least about 10:1, such as at least about 20:1. In some embodiments, any of these materials is etched in a presence of tin oxide with an etch selectivity of at least about 10:1, such as at least about 20:1.

In some embodiments, tin oxide is used in patterning processes, where the tin oxide film is a spacer, or a hardmask (e.g., a middle layer positioned below photoresist and above a target layer). For example, tin oxide can be a spacer in self-aligned spacer-assisted patterning, a middle layer in self-aligned double patterning (SADP) or self-aligned quadruple patterning (SAQP), a contact hole hard mask, an extreme UV (EUV) hardmask, a reverse tone mask, or a back end of the line (BEOL) hard mask. In conjunction with selective etching processes, tin oxide meets stringent critical dimension (CD)/profile and selectivity requirements that are imposed by these applications. The etching processes can be implemented on a variety of tools that allow plasma etching, such as Kiyo® and Flex™ etch tools provided by Lam Research Corporation.

Tin oxide can be etched selectively to a wide variety of materials using hydrogen-based etches that convert tin oxide to volatile tin hydride products (e.g., tin tetrahydride). The term "tin hydride" as used herein includes a plurality of tin hydrides (compounds with tin-hydrogen bonding) and is not limited only to tin tetrahydride ($SnH_4$)). Terms like "tin chloride" and "silicon fluoride" similarly may include multiple chlorides and fluorides. Tin tetrahydride, unlike hydrides of many other metals, has a low boiling point, and therefore can be easily removed from the process chambers by purging and/or evacuation thereby making hydrogen-based etch a particularly attractive process for selective tin oxide etching.

Tin oxide, as used herein, refers to materials that include tin (Sn) and oxygen (O), and may optionally include hydrogen. Tin oxide, as used herein, may further include small amounts of other elements, such as carbon, and nitrogen, where the total amount of other elements is 10 atomic % or less (where hydrogen is not included in the calculation of the content). For example, ALD-deposited tin oxide can contain about 0.5-5 atomic % carbon. Tin oxide can be deposited, for example, by ALD, PECVD, or PVD. The stoichiometry of tin oxide generally can vary. In some embodiments the atomic ratio of tin to oxygen is about 1:2 ($SnO_2$). It is understood that small deviations from 1:2 tin to oxygen stoichiometry are possible in $SnO_2$ and are within the scope of $SnO_2$ structure. For example, O to Sn atomic ratio is between about 2.0-2.3 in some examples of $SnO_2$. Tin oxides with O to Sn ratio of between about 1.5-2.5 are within the scope of $SnO_2$ material, as used herein. Tin oxide materials described herein are distinct from indium tin oxide materials, and other mixed oxides.

It is understood that in other chemical compounds as used herein, stoichiometry may vary, unless it is specified. For example, formulas such as SiN and HfO specify the elements that are present but not the stoichiometry. Further, it is understood that materials described herein may include hydrogen (even if not specified in the formula) and small amounts of dopants not explicitly listed in the chemical name (such as less than 10 atomic % of a dopant).

The term "semiconductor substrate" as used herein refers to a substrate at any stage of semiconductor device fabrication containing a semiconductor material anywhere within its structure. It is understood that the semiconductor material in the semiconductor substrate does not need to be exposed. Semiconductor wafers having a plurality of layers of other materials (e.g., dielectrics) covering the semiconductor material, are examples of semiconductor substrates. The following detailed description assumes the disclosed implementations are implemented on a wafer. However, the disclosed implementations are not so limited. The work piece may be of various shapes, sizes, and materials. In addition to semiconductor wafers, other work pieces that may take advantage of the disclosed implementations include various articles such as printed circuit boards and the like.

In some embodiments, provided selective etch chemistries are used to remove certain materials or features on a substrate without removing other materials or features. As used herein, the etch chemistry "removes" a material or feature when at least 90% (such as 100%) of the material or feature is removed (referring to thickness in vertical direction). The term "without removing", as used herein means that at least 50% of material or feature (such as at least 80%) remains after the etch, where % refers to thickness in a vertical direction.

In some embodiments provided methods are used to remove materials from horizontal surfaces without removing materials residing at sidewalls of protruding features. It is understood that horizontal surfaces, as used herein, include surfaces with local deviations from horizontal plane, such as convex caps on top of protruding features.

A variety of etch chemistries have been developed for selective etching of tin oxide in a presence of other materials, as well as for selective etching of other materials in a presence of tin oxide. Selective etching of tin oxide in a presence of another material refers to tin oxide etching, wherein the ratio of the etch rate of tin oxide to the etch rate of the other material is greater than one, and wherein the other material is exposed to the same etch chemistry as tin oxide at any time of the etching process. For example, the other material may be exposed when the etching begins, or may become exposed during the course of etching. Etch selectivity for selective etching of tin oxide in a presence of another material refers to a ratio of an etch rate of tin oxide to an etch rate of the other material for a given chemistry. For example, tin oxide can be selectively etched in a presence of a silicon-containing compound using a hydrogen-based etch chemistry with an etch selectivity of greater than 50.

Similarly, selective etching of a material in a presence of tin oxide refers to such etching of that material, where the ratio of an etch rate of that material to the etch rate of tin oxide is greater than one, and wherein tin oxide is exposed to the same etch chemistry as the etched material at any time of the etching process. For example, tin oxide may be exposed when the etching begins, or it may become exposed during the course of etching. Etch selectivity of a selective etch of a material in a presence of tin oxide refers to a ratio of an etch rate of that material to an etch rate of tin oxide for a given chemistry. For example, carbon can be selectively etched in a presence of tin oxide using an oxygen-based etch chemistry with an etch selectivity of greater than 50.

In some embodiments a semiconductor substrate is provided, where the semiconductor substrate includes an exposed tin oxide layer and a layer of a second material, where the second material may be exposed or not exposed. Next tin oxide is selectively etched in a presence of the second material using one of the selective tin oxide etch chemistries described herein. For example, tin oxide can be selectively etched using a hydrogen-based chemistry and/or chlorine-based chemistry. The second material may be exposed prior to this etch or may become exposed during the course of tin oxide etching.

In some embodiments a semiconductor substrate is provided, where the semiconductor substrate includes an exposed layer of a first material and a layer of tin oxide, where the tin oxide may be exposed or not exposed. Next, the first material is selectively etched in a presence of the tin oxide using one of the selective chemistries described herein. The tin oxide may be exposed prior to this etch or may become exposed during the course of tin oxide etching.

Hydrogen-based etch. In some embodiments selective tin oxide etching is performed using a hydrogen-based etch. Hydrogen-based etch involves exposing tin oxide to a hydrogen-containing reactant (typically with plasma activation of the reactant) such that it converts tin oxide to a volatile tin hydride. $SnH_4$ has a boiling temperature of $-52°$ C. and can be easily removed from the process chamber. Examples of hydrogen-containing reactants include $H_2$, HBr, $NH_3$, $H_2O$, and hydrocarbons (such as $CH_4$). Mixtures of hydrogen-containing reactants can also be used. Hydrogen-based etching involves forming a plasma in a process gas containing a hydrogen-containing reactant, and, optionally, an inert gas, and contacting the substrate with the formed plasma. Examples of inert gases include nitrogen ($N_2$), helium (He), argon (Ar), and neon (Ne), and xenon (Xe). In some embodiments $H_2$ is the preferred hydrogen-containing reactant, and in some embodiments it is preferable to form plasma in a gas that contains at least 50%, such as at least 80% $H_2$ by volume. In other embodiments HBr is used as the hydrogen-containing reactant. For example, tin oxide can be selectively etched with a plasma formed in a process gas consisting essentially of HBr and an inert gas, such as in a mixture of HBr, $N_2$ and argon. The hydrogen-based etch is typically conducted with a process gas that does not include oxygen-containing and fluorine-containing species. In some embodiments, the process gas consists essentially of one or more hydrogen-containing reactants and, optionally, an inert gas.

Hydrogen-based etch can selectively remove tin oxide in a presence of the following materials: silicon-containing compounds, such as $SiO_2$, SiN, SiC, SiOC, SiCN, SiON, SiCNO, spin on glass; metal oxides, such as titanium oxide, tungsten oxide, and zirconium oxide; metal nitrides, such as titanium nitride and tantalum nitride; metals, such as tungsten; photoresist and organic polymers. Further, hydrogen based etch can be used to selectively etch tin oxide in a presence of silicon oxide covered silicon. Silicon oxide often forms on silicon surfaces when silicon is exposed to atmosphere. Hydrogen-based etch can be also used to selectively etch tin oxide in a presence of elemental silicon (e.g., amorphous silicon), and carbon. Further, hydrogen-based etch can be used to selectively etch tin oxide in a presence of metal carbides, and materials that contain metal and carbon. For example, tin oxide can be selectively etched with a hydrogen-based etch in a presence of a tungsten carbon material (also referred to as tungsten-doped carbon). In some embodiments, tungsten carbon material includes between about 20-60 atomic % tungsten.

In some embodiments a semiconductor substrate is provided, where the semiconductor substrate includes an exposed tin oxide layer and a layer of any of these materials. Next, tin oxide is selectively etched in a presence of these materials. These materials may be exposed prior to this etch or may become exposed during the course of tin oxide etching.

The etch selectivity of the hydrogen-based etch in some embodiments is greater than 10, such as greater than 30, e.g., greater than 50, or greater than 80. The etch selectivity refers to the ratio of the etch rate of tin oxide to the etch rate of the other material for selected process conditions. In some examples, etch selectivity of 100 was achieved for etching tin oxide relative to $SiO_2$ with the use of $H_2$ plasma.

The tin oxide etching methods that utilize hydrogen plasma (referring to a plasma formed in a hydrogen-containing reactant) can be implemented in a variety of apparatuses under a wide range of process conditions. In one implementation the methods involve, providing a semiconductor substrate having an exposed layer of tin oxide to an etch chamber, and contacting the substrate with a plasma formed in a process gas comprising $H_2$ (or another hydrogen-containing gas), and, optionally a carrier gas, such as helium or another inert gas. The term "etch chamber" or an "etching apparatus" refers to a chamber and an apparatus that are configured for etching. In some embodiments the "etch chamber" or the "etching apparatus" are exclusively configured for etching operations. In other embodiments the "etch chamber" or "etching apparatus" may be configured to perform other operations in addition to etching, such as, for example, deposition. For example, in some embodiments the etch chamber may also be used for ALD deposition.

In some embodiments the plasma used for in the hydrogen plasma etch is generated in the same process chamber that houses the semiconductor substrate. In other embodiments the plasma is generated remotely, and is introduced into the process chamber that houses the substrate through one or more inlets in the process chamber.

The etching is controlled such as to convert tin oxide to a volatile tin hydride. In one embodiment the $H_2$ content in the process gas is at least 50% by volume, such as at least 80% by volume (can be up to and including 100%). In some embodiments, the process gas may further include a hydrocarbon, such as $CH_4$. In some embodiments, the process gas further includes $Cl_2$. For example, the process gas may consist essentially of $H_2$ and an inert gas (e.g., He), or the process gas may consist essentially of $H_2$, inert gas and a hydrocarbon (e.g., $CH_4$). The etch is performed at a temperature of less than about 100° C., measured near the substrate. The etch reaction, advantageously, generates only volatile materials, such as $SnH_4$, which can be easily removed from the etch process chamber by evacuation and/or purging. The etch process temperature is preferably selected to be less than about 100° C., because higher temperatures can lead to decomposition of formed $SnH_4$ and to formation of particles that can contaminate the process chamber and the substrate. The composition of the process gas and process conditions are selected such as to reduce or eliminate formation of particles during the etch. Significantly, the etch reaction does not require any significant sputtering component, and can be performed in an absence of external bias at the substrate, and in an absence of heavy ions (e.g., argon ions). Reducing sputtering component can be beneficial for increasing the etch selectivity relative to the second material on the substrate. Thus, in some embodiments etching is performed without providing an external bias to the substrate and/or involves using helium (a light gas) as the carrier gas, in order to reduce sputtering.

Plasma for the hydrogen plasma etch can be generated using a variety of frequencies (low and high). Examples of suitable frequencies include 400 KHz, 2 MHz, 13.56 MHz, 27 MHz or 2.45 GHz. Power used for plasma generation can range in some embodiments, from between about 50 W to 1,000 W corresponding to power density of between about 0.0018 and 0.36 $W/cm^2$. The bias at the substrate is optional, and bias power can range from about 0 to 500 W. Suitable gas flow rates per showerhead (for processing one 300 mm wafer) are:

$H_2$: 25 to 750 sccm;
$Cl_2$: 0 to 500 sccm (e.g., 5-200 sccm);
He: 0 to 500 sccm (e.g., 5-100 sccm); and
$CH_4$: 0 to 500 sccm (e.g., 5-100 sccm).

The etch process can be performed, in some embodiments, at a pressure of between about 1 to 175 mTorr.

In some specific embodiments the plasma is generated using high frequency generation (e.g., 13.56 MHz or 27 MHz), and it is provided using plasma power of between about 200 to 500 W corresponding to power density of 0.07 and 0.18 $W/cm^2$. The power for the bias at the substrate is between about 0 and 200 W. Suitable gas flow rates per showerhead (for processing one 300 mm wafer) are:

$H_2$: 100 to 300 sccm;
$Cl_2$: 0 to 200 sccm (e.g., 5-100 sccm);
He: 0 to 100 sccm (e.g., 5-50 sccm);
$CH_4$: 0 to 100 sccm (e.g., 5-50 sccm).

The etch process is performed in these embodiments at a pressure of between about 1 to 30 mTorr.

It was discovered that the selectivity of the hydrogen-based etch can be significantly increased by using carbon-containing reactants in the process gas that form a carbon-containing polymer (e.g. $CH_x$ polymer) on the surface of the substrate during the etch. In some embodiments, the process gas used in this embodiment includes $H_2$ and a hydrocarbon (e.g., methane ($CH_4$)). The process gas typically also includes an inert gas. The ratio of $H_2$ to hydrocarbon, in some embodiments is preferably at least 5, such as at least 10. In some embodiments the volume ratio of $H_2$ to hydrocarbon is between about 5-500, such as about 10-300. In some embodiments selective etching of tin oxide in a presence of another material (or materials) includes exposing the substrate to a plasma formed in a process gas comprising $H_2$ and a hydrocarbon (e.g., $CH_4$). In one implementation $H_2$ is provided at a flow rate of between about 100-500 sccm, and hydrocarbon is provided at a flow rate of between about 1-20 sccm (such as between about 5-10 sccm). The process can be conducted using plasma power of between about 100-1,000 W, such as between about 200-500 W (for a single 300 mm wafer), corresponding to power densities of between about 0.14-1.3 $W/cm^2$, such as 0.28-0.71 $W/cm^2$. In some implementations, the etch is conducted using a substrate bias of between about 50-500 Vb, such as between about 100-200 Vb. The process is preferably performed at a temperature of less than about 100° C. In one specific example the following gases are provided: $H_2$ at 100 sccm; $CH_4$ at 5 sccm, and helium at 100 sccm. The plasma is formed in the process gas using a power of 300 W, and the substrate bias of 100 Vb at 25% duty cycle is used. The process is performed at 30° C. and at a pressure of 5 mTorr. The formation of carbon-containing polymer on a substrate as described herein can increase the etch selectivity of tin oxide relative to any of the materials listed herein. This effect is particularly useful when tin oxide is etched in a presence of photoresist, carbon, carbon-containing materials, and silicon (Si). For example, when the etching is conducted in a presence of photoresist, the etch selectivity can be greater than 100, and in some cases is nearly infinite. The use of this highly selective etch allows the use of photoresist of smaller thickness to lower photolithographic exposure dose and/or to prevent photoresist line collapse due to high aspect ratio at small fine pitch. In the described method the $CH_x$ polymer protects the photoresist from being etched. Further this etch can be used to improve the geometry of the photoresist layer. In some embodiments, the tin oxide on a semiconductor substrate is selectively etched using this etch in a presence of a photoresist disposed above the tin oxide layer, and in a presence of a material that underlies tin oxide, with an etch selectivity of at least 10 relative to both photoresist and the material that underlies tin oxide. In some embodiments the material that underlies tin oxide includes one or more of silicon (e.g., amorphous silicon), silicon-containing compound (e.g., $SiO_2$, SiN, SiC, SiON, SiOC), carbon (e.g., amorphous carbon), and a carbon-containing compound (e.g., carbon tungsten).

In some embodiments, HBr is used as a hydrogen-containing reactant in the hydrogen-based etch. In one implementation, the etching method involves flowing HBr, and an inert gas (e.g., helium) at a flow rate of 100-500 sccm and forming a plasma in this process gas using RF power of 100-500 W (per one 300 mm wafer) corresponding to power densities of 0.14-0.71 $W/cm^2$. This etch can be conducted with or without a substrate bias. For example, substrate bias may be between 0-200 Vb, such as 50-200 Vb. The process can be performed at a temperature of less than 100° C. and a pressure of 5-50 mTorr.

Chlorine-based etch. In some embodiments selective tin oxide etching is performed using a chlorine-based etch. Chlorine-based etch involves exposing tin oxide to a chlorine-containing reactant (typically with plasma activation of the reactant) such that it converts tin oxide to a tin chloride. $SnCl_4$ has a boiling point of 114° C. and can be removed from the process chambers. Examples of suitable chlorine-containing reactants include $Cl_2$, and $BCl_3$. Mixture of $Cl_2$ and $BCl_3$ is used in one embodiment. Chlorine-based etching involves, in one implementation, forming a plasma in a process gas containing a chlorine-containing reactant, and, optionally, an inert gas, and contacting the substrate with the formed plasma. Chlorine-based etch can selectively remove tin oxide in a presence of the following materials: silicon-containing compounds, such as $SiO_2$, SiN, SiC, SiOC, SiCN, SiON, SiCNO, spin on glass, carbon, and photoresist, although the selectivity for silicon-containing material is typically lower than with a hydrogen-based etch. In some embodiments a semiconductor substrate is provided, where the semiconductor substrate includes an exposed tin oxide layer and a layer of any of these materials. Next, tin oxide is selectively etched in a presence of these materials using the chlorine-based etch. These materials may be exposed prior to this etch or may become exposed during the course of tin oxide etching. In one implementation tin oxide is selectively etched in a presence of any of these materials using a $BCl_3/Cl_2$ etch. In one implementation, the etching method involves flowing $BCl_3$ at a flow rate of 5-100 sccm, $Cl_2$ at a flow rate of 50-500 sccm and an inert gas (e.g., helium) at a flow rate of 100-500 sccm and forming a plasma in this process gas using RF power of 100-500 W (per one 300 mm wafer) corresponding to power densities of 0.14-0.71 $W/cm^2$. This etch can be conducted with or without a substrate bias. For example, substrate bias may be between 0-100 Vb, such as 10-100 Vb. The process can be performed at a temperature of less than 100° C. and a pressure of 5-50 mTorr.

In some embodiments chlorine-based etch is used to selectively etch certain metal oxides in a presence of tin oxide. For example, titanium oxide can be selectively etched in a presence of tin oxide using chlorine-based etch. In some embodiments a semiconductor substrate is provided, where the semiconductor substrate includes an exposed titanium oxide layer and a layer of tin oxide. Next, titanium oxide is selectively etched in a presence of tin oxide using the chlorine-based etch chemistry. Tin oxide may be exposed prior to this etch or may become exposed during the course of tin oxide etching.

Fluorocarbon-based etch. In some embodiments silicon-containing compounds such as $SiO_2$, SiN, SiC, SiOC, SiCN, SiON, SiCNO, spin on glass are selectively etched in a presence of tin oxide using a fluorocarbon-based etch. Fluorocarbon-based etch involves exposing the silicon-containing compounds to plasma-activated fluorocarbons ($C_xF_y$) such that they are converted to volatile compounds containing Si—F bonds. Examples of suitable fluorocarbon reactants include $CF_4$, $C_2F_6$ and the like. Fluorocarbon-based etching involves, in one implementation, forming a plasma in a process gas containing a fluorocarbon, and, optionally, an inert gas, and contacting the substrate with the formed plasma. Fluorocarbon etch can selectively remove silicon-containing compounds in a presence of tin oxide. In some embodiments a semiconductor substrate is provided, where the semiconductor substrate includes an exposed layer of a silicon-containing compound and a layer of tin oxide. Next, the substrate is contacted with a fluorocarbon plasma and the silicon-containing compound is selectively etched in a presence of tin oxide. Tin oxide may be exposed prior to this etch or may become exposed during the course of etching. Fluorocarbon-based etch is a type of a fluorine-based etch.

Fluorine-based etch. In some embodiments elemental silicon and silicon-containing compounds such as $SiO_2$, SiN, SiC, SiOC, SiCN, SiON, SiCNO, and spin on glass are selectively etched in a presence of tin oxide using a fluorine-based etch. Fluorine-based etch involves exposing the silicon-containing material to a fluorine-containing reagent (e.g., $NF_3$, $SF_6$, or a fluorocarbon), which is in some embodiments plasma-activated, and converting the silicon-containing material to a volatile silicon fluoride. Tin oxide, however, does not form a volatile fluoride and therefore is not substantially etched by this chemistry. In addition to silicon-containing materials, titanium oxide, tungsten, and tungsten carbon can be selectively etched in a presence of tin oxide using fluorine-based etches. Fluorine-based etching involves, in one implementation, forming a plasma in a process gas containing a fluorine-containing reactant (e.g., $NF_3$), and, optionally, an inert gas, and contacting the substrate with the formed plasma. Fluorine-based etch can selectively remove silicon-containing compounds and elemental silicon in a presence of tin oxide. In some embodiments a semiconductor substrate is provided, where the semiconductor substrate includes an exposed layer of a silicon-containing compound and/or a layer of elemental silicon (Si) and a layer of tin oxide. Next, the substrate is contacted with a fluorine-containing reactant in a plasma and the silicon-containing compound and/or Si is selectively etched in a presence of tin oxide. Tin oxide may be exposed prior to this etch or may become exposed during the course of etching.

In one implementation silicon (Si) is selectively etched in a presence of tin oxide using a fluorine-based etch. In one implementation, this etching method involves flowing $NF_3$ at a flow rate of 5-100 sccm, $Cl_2$ at a flow rate of 50-500 sccm and an inert gas (e.g., nitrogen and/or helium) at a flow rate of 100-500 sccm and forming a plasma in this process gas using RF power of 100-1000 W (per one 300 mm wafer) corresponding to power densities of 0.14-1.4 W/cm$^2$. This etch can be conducted with or without a substrate bias. For example, substrate bias may be between 0-100 Vb, such as 10-100 Vb. The process can be performed at a temperature of less than 100° C. and a pressure of 10-300 mTorr.

In some embodiments a semiconductor substrate is provided, where the semiconductor substrate includes an exposed layer of a titanium oxide, tungsten, and/or tungsten carbon; and a layer of tin oxide. Next, the substrate is contacted with a fluorine-containing reactant in a plasma and titanium oxide, tungsten, and/or tungsten carbon is selectively etched in a presence of tin oxide. Tin oxide may be exposed prior to this etch or may become exposed during the course of etching.

In one implementation titanium oxide is selectively etched in a presence of tin oxide using a fluorine-based etch. In one implementation, this etching method involves flowing $CF_4$ at a flow rate of 5-500 sccm, $CHF_3$ at a flow rate of 0-500 sccm (e.g., 10-500 sccm) and an inert gas (e.g., argon) at a flow rate of 100-500 sccm and forming a plasma in this process gas using RF power of 500-1000 W (per one 300 mm wafer) corresponding to power densities of 0.71-1.4 W/cm$^2$. This etch can be conducted with or without a substrate bias. For example, substrate bias may be between 0-300 Vb, such as 10-300 Vb. The process can be performed at a temperature of less than 100° C. and a pressure of 5-50 mTorr.

In one implementation tungsten carbon is selectively etched in a presence of tin oxide using a fluorine-based etch. In one implementation, this etching method involves flowing $NF_3$ at a flow rate of 5-100 sccm, $Cl_2$ at a flow rate of 5-500 sccm and an inert gas (e.g., argon and/or nitrogen) at a flow rate of 100-500 sccm and forming a plasma in this process gas using RF power of 100-1000 W (per one 300 mm wafer) corresponding to power densities of 0.14-1.4 W/cm$^2$. This etch can be conducted with or without a substrate bias. For example, substrate bias may be between 0-100 Vb, such as 10-100 Vb. The process can be performed at a temperature of less than 100° C. and a pressure of 10-100 mTorr.

Oxygen-based etch. In some embodiments one or more materials selected from the group consisting of elemental carbon, carbon-containing compounds, polymers, and photoresist is selectively etched in a presence of tin oxide using an oxygen-based etch. Oxygen-based etch involves exposing the materials listed above to an oxygen-containing reagent (e.g., $O_2$, $O_3$, $SO_2$, or $CO_2$), which is in some embodiments plasma-activated, and converting the material to a volatile product containing carbon-oxygen bond (e.g., CO or $CO_2$). Oxygen-based etching involves, in one implementation, forming a plasma in a process gas containing an oxygen-containing reactant (e.g., $O_2$), and, optionally, an inert gas, and contacting the substrate with the formed plasma. In other embodiments etching may occur in an absence of plasma. Oxygen-based etch can selectively remove carbon (e.g., amorphous or diamond-like carbon), carbon-containing compounds, and photoresist in a presence of tin oxide. In some embodiments a semiconductor substrate is provided, where the semiconductor substrate includes an exposed layer of one or more materials selected from the group consisting of carbon, a carbon-containing compound and a photoresist, and a layer of tin oxide. Next, the substrate is contacted with an oxygen-containing reactant (optionally activated in a plasma) to convert carbon-containing materials to volatile CO or $CO_2$ thereby selectively etching them in a presence of tin oxide. Tin oxide may be exposed prior to this etch or may become exposed during the course of etching.

Deposition of materials. Materials that are referenced herein can be deposited using a variety of deposition methods, such as CVD (which includes PECVD), ALD (which includes PEALD), PVD (e.g., for deposition of metals and metal oxides), spin-on methods (e.g., for deposition of carbon, and some dielectrics). When conformal deposition is needed, ALD methods are typically preferred.

$SiO_2$, SiC, SiN, SiOC, SiNO, SiCNO, and SiCN materials can be deposited using a variety of methods, such as CVD, PECVD and ALD. The deposition can include a reaction between a silicon-containing precursor and a reactant (e.g., an oxygen-containing reactant, a nitrogen-containing reactant, or a carbon-containing reactant). A variety of silicon-containing precursors can be used for deposition of these materials, including silane, tetraalkylsilanes, trialkylsilanes, tetraethylorthosilicate (TEOS), etc. For example, $SiO_2$ may be deposited using TEOS or silane as the silicon-containing precursor.

Carbon can be deposited by a CVD or PECVD method by using, for example, a hydrocarbon precursor (e.g., $CH_4$). In other implementations carbon may be deposited by spin-on methods or by PVD. Photoresist and organic polymers can be deposited, for example, by spin on methods.

The tin oxide layer is deposited by any suitable method such as by CVD (including PECVD), ALD (including PEALD), sputtering, etc. In some embodiments it is preferable to deposit the $SnO_2$ film conformally, such that it follows the surface of the substrate, including the surfaces of any protrusions and recessed features on the substrate. One of the suitable deposition methods of conformal $SnO_2$ film is ALD. Thermal or plasma enhanced ALD can be used. In a typical thermal ALD method, the substrate is provided to an ALD process chamber and is sequentially exposed to a tin-containing precursor, and an oxygen-containing reactant, where the tin-containing precursor and the oxygen containing reactant are allowed to react on the surface of the substrate to form $SnO_2$. The ALD process chamber is typically purged with an inert gas after the substrate is exposed to the tin-containing precursor, and before the oxygen-containing reactant is admitted to the process chamber to prevent reaction in the bulk of the process chamber. Further, the ALD process chamber is typically purged with an inert gas after the substrate has been treated with the oxygen-containing reactant. The sequential exposure is repeated for several cycles, e.g., between about 10-100 cycles can be performed until the tin oxide layer having a desired thickness is deposited. Examples of suitable tin-containing precursors include halogenated tin-containing precursors (such as $SnCl_4$, and $SnBr_4$), and non-halogenated tin-containing precursors, such as organotin compounds, which include alkyl substituted tin amides and the like. Specific examples of alkyl substituted tin amides that are suitable for ALD are tetrakis(dimethylamino) tin, tetrakis (ethylmethylamino) tin, $N^2,N^3$-di-tert-butyl-butane-2,3-di-amino-tin(II) and (1,3-bis(1,1-dimethylethyl)-4,5-dimethyl-(4R,5R)-1,3,2-diazastannolidin-2-ylidene.

Exemplary tin-containing precursor can be, or include, organotin precursors such as, tetraethyl tin ($SnEt_4$), tetramethyl tin ($SnMe_4$), tetrakis(dimethylamino)tin ($Sn(NMe_2)_4$), tetrakis(diethylamido)tin (Sn(NEt$_2$)$_4$), tetrakis(ethylmethyl-amino)tin (Sn(NMeEt)$_4$), (dimethylamino)trimethyltin(IV) (Me$_3$Sn(NMe$_2$)), dibutyltin diacetate (Bu$_2$Sn(OAc)$_2$), Sn(II) (1,3-bis(1,1-dimethylethyl)-4,5-dimethyl-(4R,5R)-1,3,2-di-azastannolidin-2-ylidene), N$^2$, N$^3$-di-tert-butyl-butane-2,3-diamino-tin(II), and the like. Additional examples of organotin precursors include: bis[bis(trimethylsilyl)amino]tin(II)

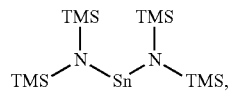

where TMS is trimethylsilyl,
dibutyldiphenyltin

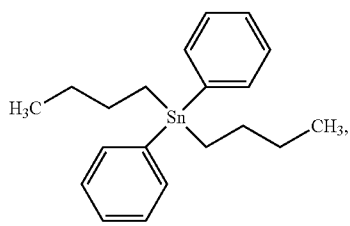 [SMILES: CCC[CH2][Sn]([CH2]CCC)([c]1ccccc1)[c]1ccccc1]

hexaphenylditin(IV)

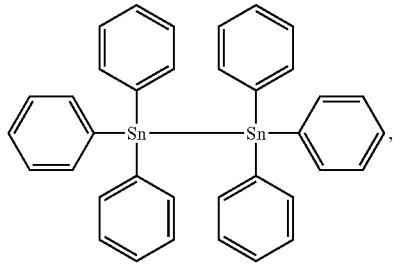 [SMILES: c1cc[c]([Sn]([CH2][CH2][Sn]([c]2ccccc2)([c]2ccccc2)[c]2ccccc2)([c]2ccccc2)[c]2ccccc2)cc1]

tetraallyltin

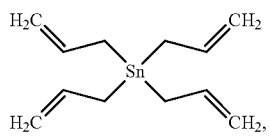

tetravinyltin

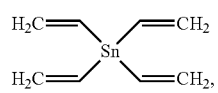

tin(II) acetylacetonate

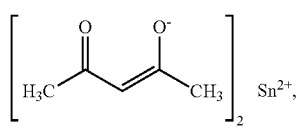

tricyclohexyltin hydride

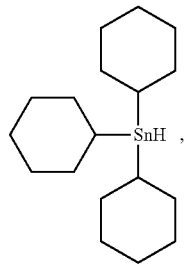

trimethyl(phenylethynyl)tin

and
trimethylphenyltin

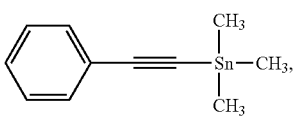

In another example, tin-containing precursors can also be inorganic tin precursors, such as, tin halides (e.g., SnF$_2$, SnCl$_4$, SnBr$_4$), tin hydrides (e.g., SnH$_4$), and the like. In some embodiments chlorinated organotin precursors are used such as trimethyltin chloride

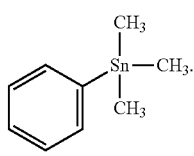

dimethyltin dichloride

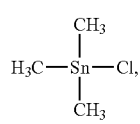

and
methyltin trichloride

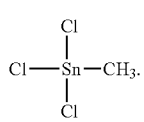

In some embodiments the tin-containing precursor is tetramethyl tin, tetrakis(dimethylamino)tin, or (dimethyl-amino)trimethyltin(IV).

Oxygen-containing reactants include without limitation oxygen, ozone, water, hydrogen peroxide, and NO. Mixtures of oxygen-containing reactants can also be used. The deposition conditions will vary depending on the choice of ALD reactants, where more reactive precursors will generally react at lower temperatures than less reactive precursors. The processes typically will be carried out at a temperature of between about 20-500° C., and at a subatmospheric pressure. The temperature and pressure are selected such that the reactants remain in the gaseous form in the process chamber to avoid condensation. Each reactant is provided to the process chamber in a gaseous form either alone or mixed with a carrier gas, such as argon, helium, or nitrogen. The flow rates of these mixtures will depend on the size of the process chamber, and are in some embodiments between about 10-10,000 sccm.

In one example the ALD process includes sequentially and alternately exposing the substrate in an ALD vacuum chamber to $SnCl_4$ (the tin-containing precursor) and deionized water (the oxygen-containing reactant) at a temperature of 200-400° C. In a specific example of an ALD cycle, a mixture of $SnCl_4$ vapor with $N_2$ carrier gas is introduced into the ALD process chamber for 0.5 seconds, and is then exposed to the substrate for 3 seconds. Next the ALD process chamber is purged with $N_2$ for 10 seconds to remove $SnCl_4$ from the bulk of the process chamber, and a mixture of $H_2O$ vapor with $N_2$ carrier gas is flowed into the process chamber for 1 second and is exposed to the substrate for 3 seconds. Next, the ALD process chamber is purged with $N_2$ and the cycle is repeated. The ALD process is performed at subatmospheric pressure (e.g., 0.4 Torr) and at a temperature of 200-400° C.

While the use of halogenated tin precursors in ALD is suitable in many embodiments, in some embodiments it is more preferable to use non-halogenated organotin precursors to avoid corrosion problems that may occur with the use of halogenated precursors such as $SnCl_4$. Examples of suitable non-halogenated organotin precursors include alkylaminotin (alkylated tin amide) precursors, such as tetrakis (dimethylamino) tin. In one example of an ALD process the substrate is sequentially exposed in an ALD chamber to tetrakis(dimethylamino) tin and $H_2O_2$ at a temperature of between about 50-300° C. Advantageously, the use of this precursor allows deposition of $SnO_2$ films at low temperatures of 100° C. or less. For example, $SnO_2$ films can be deposited at 50° C. without the use of plasma to enhance reaction rate.

In some embodiments, $SnO_2$ films are deposited by PEALD. The same types of tin-containing precursors and oxygen-containing reactants as described above for thermal ALD can be used. In PEALD the ALD apparatus is equipped with a system for generating plasma in the process chamber, and for treating the substrate with the plasma. In a typical PEALD process sequence, the substrate is provided to the PEALD process chamber and is exposed to the tin-containing precursor which adsorbs on the surface of the substrate. The process chamber is purged with an inert gas (e.g., argon or helium) to remove the precursor from the process chamber, and the substrate is exposed to an oxygen-containing reactant which is introduced into the process chamber. Concurrently with the introduction of the oxygen-containing reactant or after a delay, plasma is formed in the process chamber. The plasma facilitates the reaction between the tin-containing precursor and the oxygen-containing reactant on the surface of the substrate that results in formation of tin oxide. Next, the process chamber is purged with an inert gas, and the cycle comprising tin precursor dosing, purging, oxygen-containing reactant dosing, plasma treatment, and second purging is repeated as many times as necessary to form a tin oxide film of desired thickness.

Tin Oxide as a Spacer

Figure 1B:
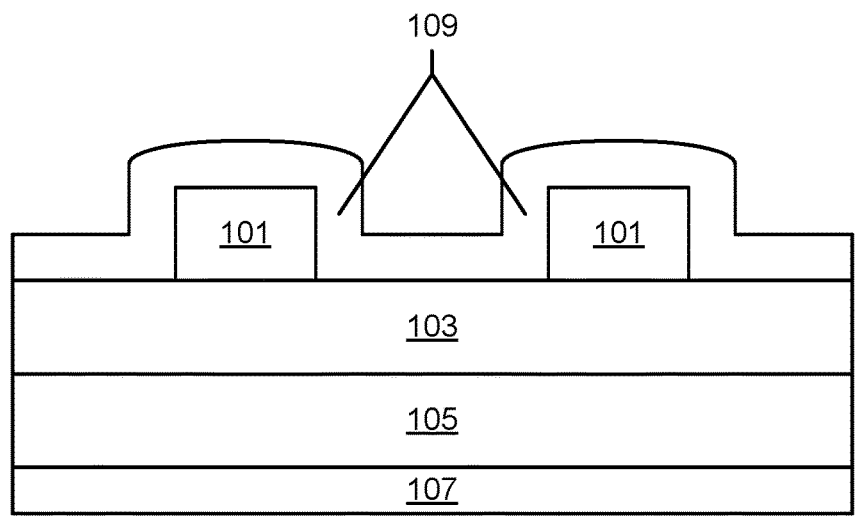
Figure 1C:
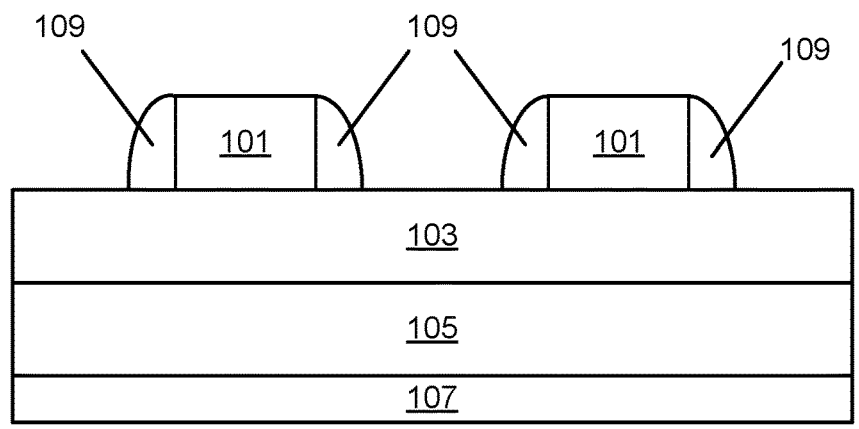

In some embodiments tin oxide layers are used as spacers. The use of tin oxide spacers is illustrated with reference to FIGS. 1A-1F, which provide schematic cross-sectional views of a semiconductor substrate at different stages of processing. FIG. 2 provides a process flow diagram for an embodiment of these methods.

Referring to FIG. 2, the process starts in 201, by providing a substrate having a plurality of protruding features. An illustrative substrate is shown in FIG. 1A, which shows two mandrels 101 residing on an etch stop layer (ESL) 103. The distance d1 between the neighboring mandrels is, in some embodiments, between about 10-100 nm. In some embodiments relatively larger distances of about 40-100 nm are used. In other applications, the distance between closest mandrels is between about 10-30 nm. The distance between the centers of closest mandrels, d2, which is also referred to as pitch, is, in some embodiments, between about 30-130 nm. In some embodiments, the pitch is between about 80-130 nm. In other embodiments, the pitch is between about 30-40 nm. The height of the mandrels d3 is typically between about 20-200 nm, such as between about 50-100 nm.

The materials of the mandrel and of the ESL are selected such as to allow subsequent selective etching of the mandrel material in the presence of exposed tin oxide, and selective etching of the ESL material in the presence of exposed tin oxide. Thus, the ratio of the etch rate of the ESL material to the etch rate of tin oxide is greater than 1, more preferably greater than about 1.5, such as greater than about 2 for a first etch chemistry. Similarly, the ratio of the etch rate of the mandrel material to the etch rate of tin oxide is greater than 1, more preferably greater than about 1.5, such as greater than about 2 for a second etch chemistry.

In some embodiments the ESL material is a silicon-containing compound (e.g., $SiO_2$), or a metal oxide (e.g., titanium oxide, zirconium oxide, tungsten oxide). The mandrel material may include silicon-containing compound (e.g., $SiO_2$, SiN, or SiC), a carbon-containing compound (e.g., amorphous carbon, diamond-like carbon or photoresist), amorphous silicon (doped or undoped) and a metal oxide (TaO, TiO, WO, ZrO, HfO). In some embodiments the outer material of the mandrel may be different from the mandrel core. For example, in some embodiments the mandrel is made of amorphous silicon which is covered with silicon oxide (e.g., with a spontaneously formed layer of thermal oxide). The ESL layer and the mandrels can be formed by one or more of physical vapor deposition (PVD), chemical vapor deposition (CVD), ALD (without plasma or by PEALD) or plasma enhanced chemical vapor deposition (PECVD) and the pattern of the mandrels can be defined using photolithographic techniques. Examples of suitable ESL/mandrel combination include: (i) a silicon oxide ESL and a silicon oxide covered silicon mandrel; (ii) a silicon oxide ESL and a carbon-containing mandrel; (iii) a silicon oxide ESL and a metal oxide mandrel; (iv) a metal oxide ESL and a silicon oxide covered silicon mandrel; (v) a metal oxide ESL and a carbon-containing mandrel.

Referring again to the substrate shown in FIG. 1A, the ESL layer 103 resides over and in contact with the target layer 105. The target layer 105 is the layer that needs to be patterned. The target layer 105 may be a semiconductor, dielectric or other layer and may be made of silicon (Si), silicon oxide ($SiO_2$), silicon nitride (SiN), or titanium nitride (TiN), for example. In some embodiments the target layer is referred to as a hardmask layer and includes metal nitride, such as titanium nitride. The target layer 105 may be deposited by ALD (without plasma or by PEALD), CVD, or other suitable deposition technique.

The target layer 105 resides over and in contact with layer 107, which is in some embodiments a BEOL layer, that includes a plurality of metal lines embedded into a layer of dielectric material.

Referring again to FIG. 2, the process follows in 203 by depositing a tin oxide layer over both the horizontal surfaces and sidewalls of the protruding features. Referring to the structure shown in FIG. 1B, the tin oxide layer 109 is deposited over the ESL 103, and over the mandrels 101, including the sidewalls of the mandrels. The tin oxide layer is deposited by any suitable method such as by CVD (including PECVD), ALD (including PEALD), sputtering, etc. In some embodiments it is preferable to deposit the tin oxide film conformally, such that it follows the surface of the layer 103 and the mandrels 101, as shown in FIG. 1B. In some embodiments the tin oxide layer is deposited conformally to a thickness of between about 5-30 nm, such as between about 10-20 nm. One of the suitable deposition methods of conformal tin oxide film is ALD. Thermal or plasma enhanced ALD can be used.

Referring to the process diagram of FIG. 2, after the tin oxide layer has been deposited, the process follows in 205 by completely removing the tin oxide from the horizontal surfaces, without completely removing the tin oxide layer from the sidewalls of the protruding features using hydrogen-based etch or a chlorine-based etch. If the mandrels have silicon-containing compounds or metal oxides as the outer layer a hydrogen-based etch can be used. If the outer layer of the mandrels is a carbon layer, chlorine-based etch can be used. The etch chemistry utilized in this step should be preferably selective to both the ESL material and to the material of the outer layer of the mandrel, i.e., the etch rate of tin oxide for this etch chemistry should be greater than the etch rate of the outer mandrel material and greater than the etch rate of the ESL material. Removal of tin oxide from horizontal surfaces is illustrated by FIG. 1C. The tin oxide layer 109 is etched from the horizontal surfaces over ESL 103 and over mandrels 101, without being fully etched from positions that adhere to the sidewalls of mandrels 101. This etch exposes the layer 103 everywhere with the exception of locations near the sidewalls of the mandrels 101. Further, this etch exposes the top portions of the mandrels. The resulting structure is shown in FIG. 1C. Preferably after this etch at least 50%, such as at least 80% or at least 90% of the initial height of the tin oxide layer at the sidewall is preserved. In one example tin oxide is selectively etched from a silicon oxide covered mandrel by a hydrogen-based etch (e.g., $H_2$ plasma etch) such that the outer material of the mandrel ($SiO_2$) is exposed. Hydrogen-based etch is selective to $SiO_2$. In another example tin oxide is selectively etched from a carbon-containing (e.g., carbon) mandrel by a chlorine-based etch (e.g., $BCl_3/Cl_2$ plasma etch) such that the carbon-containing material of the mandrel is exposed. Such etch is selective to carbon-containing materials. In another example tin oxide is selectively etched from a metal oxide (e.g., titanium oxide) mandrel by a hydrogen-based etch (e.g., $H_2$ plasma etch) such that mandrel material (metal oxide) is exposed. This etch is selective to oxides of metals that do not form volatile hydrides, such as titanium oxide.

In some embodiments, removal of the tin oxide layer from horizontal portions of the substrate involves using two steps with two different chemistries. In a first step, referred to as the main etch, the bulk of the tin oxide layer is removed from horizontal surfaces typically without fully exposing the underlying layers of mandrel and ESL materials. Etch chemistry of the main etch, therefore, in some embodiments, does not need to be selective. In some embodiments the main etch is performed by treating the substrate with a chlorine-based chemistry (e.g., $BCl_3/Cl_2$ plasma etch). After the main etch etches through the SnO film or shortly before, the etching chemistry is switched to an over etch chemistry. The endpoint for the main etch can be detected by using an optical probe, which will signal when the mandrel material or ESL material becomes exposed. Selective over etch chemistry is used to remove leftover tin oxide film without substantially etching the materials of mandrel and ESL and has been described above. For example, a selective hydrogen-based etch or a selective chlorine-based etch may be used.

Figure 1D:
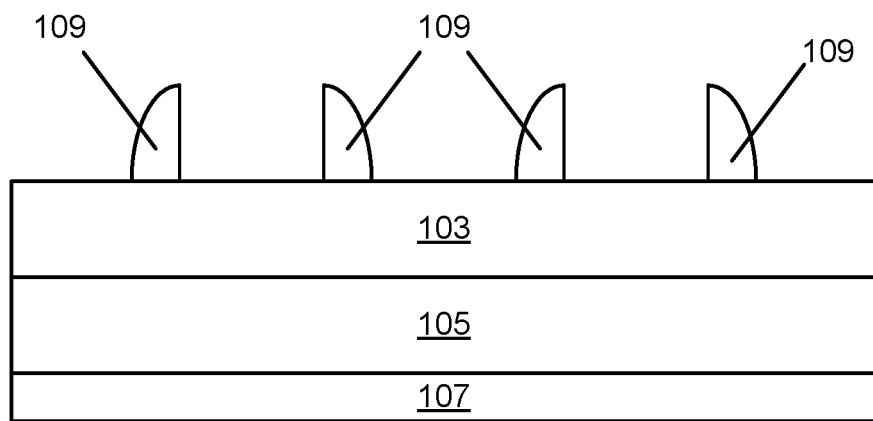
Figure 2:
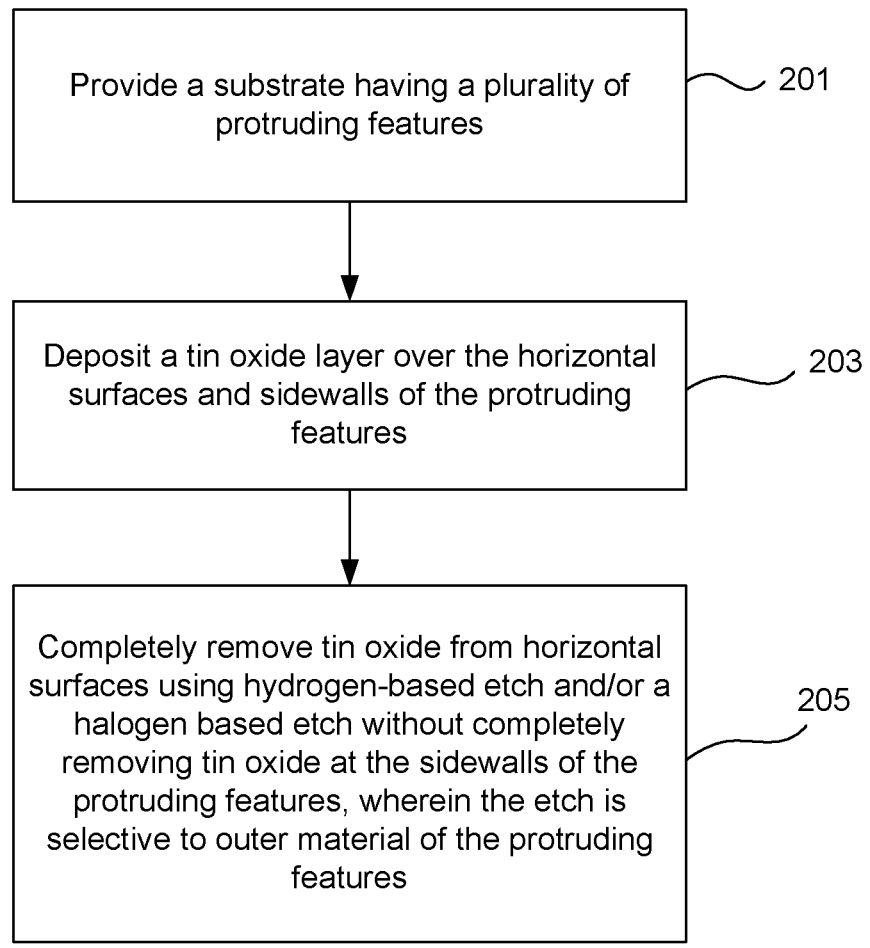
FIG. 2 is a process flow diagram for a method according to an embodiment provided herein.

Next, mandrels 101 are removed from the substrate leaving exposed tin oxide spacers 101 and an exposed layer ESL 103, as shown in FIG. 1D. Removal of the mandrels is performed by exposing the substrate to an etch chemistry that selectively etches the mandrel material. Thus, the ratio of the etch rate of the mandrel material to the etch rate of the tin oxide in this step is greater than 1, and is more preferably greater than 1.5. Further, the etch chemistry used in this step should, in some embodiments, selectively etch the mandrel material relative to ESL material. A variety of etching methods can be used, and specific choice of chemistry depends on the material of the mandrel and on the material of the ESL layer. When the mandrel is made of amorphous silicon covered with silicon oxide, a fluorine-based chemistry (e.g., $NF_3$) or may be used to remove the silicon mandrels 101 together with the $SiO_2$ layer covering them. This chemistry is selective to tin oxide.

Another option for silicon mandrel removal is the use of a plasma formed in a mixture of HBr and $O_2$. In some embodiments, before the etch starts, the thin protective layer of silicon oxide is removed from the surface of silicon mandrels. This can be done by briefly exposing the substrate to a plasma formed in a process gas comprising a fluorocarbon. After removal of the protective silicon oxide layer from the mandrels, the silicon is selectively etched. In some embodiments, it is preferable to use a relatively small RF bias, or no external bias at all for the substrate in this step. If no external bias is used, the self bias of the substrate (10-20 V) is sufficient. Under no bias or low bias conditions, the HBr/$O_2$ plasma will selectively etch silicon in the presence of tin oxide and silicon oxide. This etch can be performed in a presence of an ESL containing silicon-containing compounds.

When the mandrel is a carbon-containing material (e.g., carbon or photoresist) the mandrel can be selectively removed using an oxygen-based etch. This chemistry is selective to tin oxide and can be used in a presence of ESL composed of silicon-containing compounds, and metal oxide ESL.

When the mandrel is a metal oxide (e.g., titanium oxide, tungsten oxide, zirconium oxide, hafnium oxide, tantalum oxide) the substrate may be treated with a chlorine-based etch chemistry (e.g., $BCl_3/Cl_2$ in a plasma) to selectively remove the mandrel relative to tin oxide. This chemistry can be used in a presence of an ESL containing silicon-containing compounds (e.g., $SiO_2$, SiN, SiC).

Figure 1E:
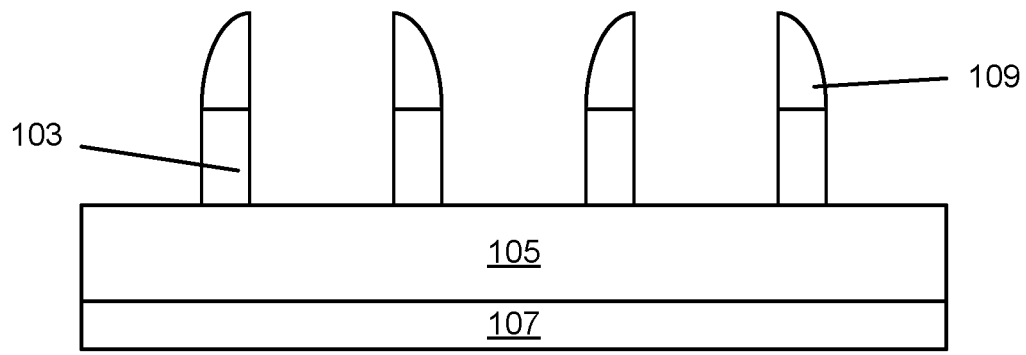
Figure 1F:
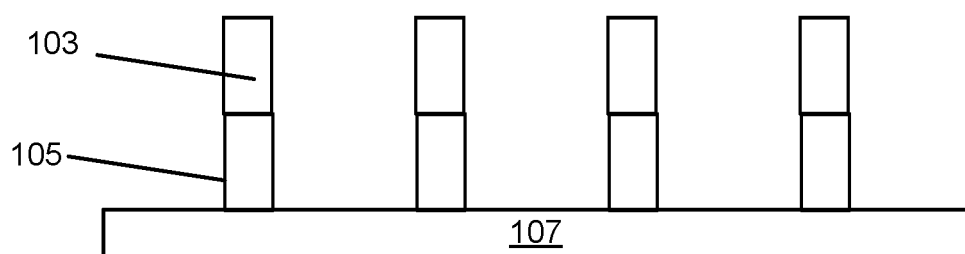

Next, the exposed ESL film 103 is etched to expose the underlying target layer 105 at all positions that are not protected by the tin oxide spacers 109. The resulting structure is shown in FIG. 1E. The etch chemistry that is used in this step selectively etches the ESL material in the presence of tin oxide. In other words, the ratio of the etch rate of the ESL material to the etch rate of tin oxide is greater than 1, and is more preferably greater than 1.5. The specific type of chemistry used in this step will depend on the type of the ESL material. When silicon-containing compounds (e.g., silicon oxide and silicon oxide based materials) are used, selective etching can be accomplished by exposing the substrate to a plasma formed in a process gas comprising a fluorocarbon. For example, the ESL film can be etched by a plasma formed in a process gas comprising one or more of $CF_4$, $C_2F_6$, and $C_3F_8$. When the ESL is a metal oxide layer (e.g., titanium oxide, tungsten oxide, or zirconium oxide), it can be etched selectively in a presence of tin oxide using a chlorine-based etch chemistry (e.g., $BCl_3/Cl_2$ in a plasma).

In the next step, the target layer 105 is etched at all positions that are not protected by the ESL film 103, to expose the underlying layer 107. The tin oxide spacers 109 are also removed in this etching step providing a patterned structure shown in FIG. 1F. In some embodiments, the etch chemistry used in this step is selected to remove both the target material and the tin oxide spacer material. In other embodiments, two different etching steps with different chemistries can be used to pattern the target layer 105 and to remove tin oxide spacers 109 respectively. A number of etching chemistries can be used depending on the chemistry of the target layer. In one embodiment the target layer 105 is a metal nitride layer (e.g., a TiN) layer. In this embodiment the metal nitride layer may be etched, and the tin oxide spacers can be removed using a single etch chemistry by exposing the substrate to a plasma formed in a process gas comprising $Cl_2$ and a hydrocarbon (e.g., $CH_4$). Generally, tin oxide spacers can be removed using any of tin oxide etching methods described above.

One of the problems encountered during formation of spacers is the footing of the spacer, which is the difference between the width of the spacer at the bottom and the width of the spacer at the top. Ideally, the spacer should be straight, having substantially same width both at top and bottom. Tin oxide spacers have been compared to titanium oxide spacers experimentally. It was shown that with the use of $H_2$ plasma etch on tin oxide spacers, the footing can be significantly reduced to less than 1 nm. Titanium oxide, however, cannot be etched by $H_2$ plasma at all. When titanium oxide spacer was etched with an $HBr/N_2$/argon plasma its footing was reduced only to 2.4 nm with the cost of greater spacer height and CD loss.

Further the etch selectivity of ALD-deposited titanium oxide to thermal silicon oxide (TOX) was demonstrated to be lower than the etch selectivity of ALD-deposited tin oxide to TOX for the $HBr/N_2$/argon plasma etch. Specifically, with this chemistry titanium oxide was etched in a presence of TOX with a selectivity of about 10:1, whereas tin oxide was etched with a selectivity of greater than 100:1. With $H_2$ plasma titanium oxide was not etched at all, whereas tin oxide was etched in a presence of TOX with a selectivity of greater than 100:1. With $BCl_3/Cl_2$/He plasma titanium oxide was etched with a selectivity of about 5:1 (titanium oxide to TOX) whereas tin oxide was etched with a selectivity of about 4:1 (tin oxide to TOX). Hydrogen-based etch chemistries (both $H_2$-based and HBr-based) provide very high etch selectivities to silicon oxide of greater than 50:1 and greater than 80:1 that cannot be achieved with titanium oxide.

In some embodiments, the methods described herein with reference to FIGS. 1A-1F and 2 are modified and involve the use of a passivation layer over tin oxide layer at the sidewalls of the mandrels. The purpose of the passivation layer is to minimize etching of tin oxide at the sidewalls during the step of tin oxide removal from horizontal surfaces. In an absence of the passivation layer, the tin oxide at the sidewalls may be inconsistently etched in a lateral direction, which may lead to spacer critical dimension (CD) variation. The use of a passivation layer can prevent or minimize this lateral etch and result in a more consistent distance between spacers. In addition, the use of a passivation layer can prevent the erosion of top corners of the spacers thereby leading to spacers with more rectangular shapes. Further, the use of a passivation layer at the sidewalls allows for more facile etch of the bottom slope or footing of the tin oxide layer as there would be more available etching species (e.g., ions in a plasma) being driven downward by a bias at the substrate. The passivation layer may eventually be consumed partially or completely in subsequent etching steps so that the spacer CD can be maintained.

The material of the passivation layer is selected such that it is more resistant to a particular etch chemistry that is being used for the removal of tin oxide from horizontal surfaces. In some embodiments, the passivation material is a silicon-containing compound such as $SiO_2$, SiN, or SiC, which can be deposited, for example by PECVD. In other embodiments the passivation material is carbon (e.g., deposited using a hydrocarbon precursor), as described herein. In other embodiments, the passivation material is a tin-containing compound, such as tin nitride (SnN), tin bromide (SnBr), or tin fluoride (SnF). In some embodiments these compounds are formed by converting an outer portion of tin oxide to the tin-containing passivation material. For example, tin oxide can be converted to tin nitride by exposing the substrate to a nitrogen-containing compound in a plasma (e.g., $N_2$ plasma). Tin bromide may be formed by exposing the substrate to a bromine-containing compound (e.g. HBr). Tin fluoride may be formed by exposing the substrate to a fluorine-containing compound in a plasma (e.g., $NF_3$ plasma or fluorocarbon plasma). The conditions during SnBr and SnF deposition are adjusted such as to minimize etching. For example, the reaction may be carried out without biasing the substrate or with low bias to minimize removal of SnBr and SnF. The passivation layer is typically formed to a thickness of about 1-5 nm.

Figure 3A:
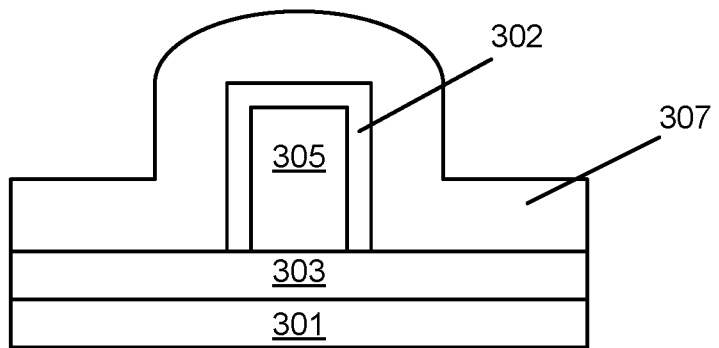
FIGS. 3A-3E show schematic cross-sectional views of a semiconductor substrate undergoing processing according to an embodiment provided herein.
Figure 3B:
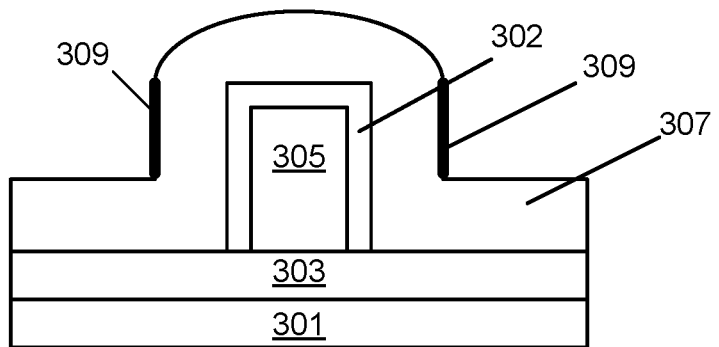
Figure 3C:
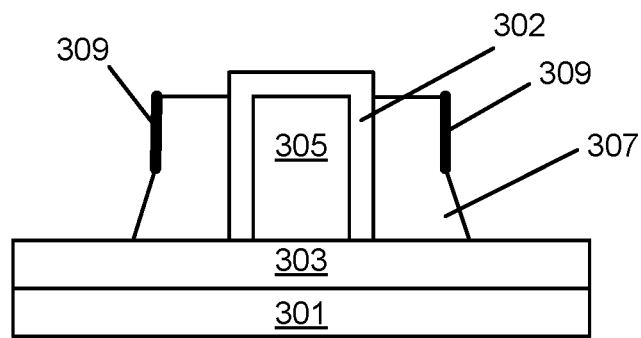
Figure 3D:
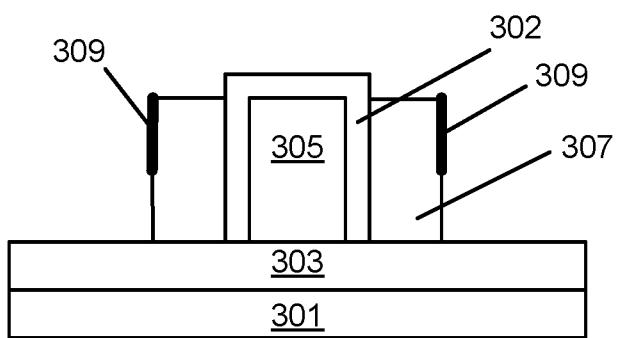
Figure 3E:
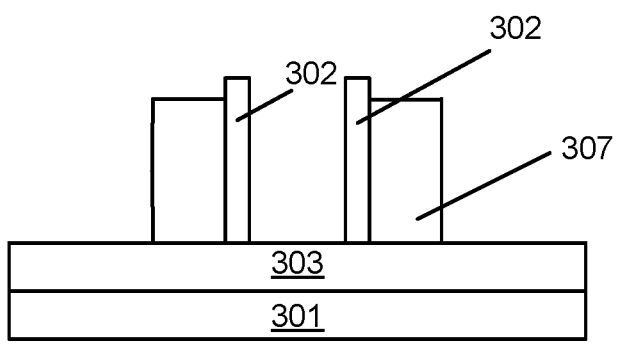
Figure 4:
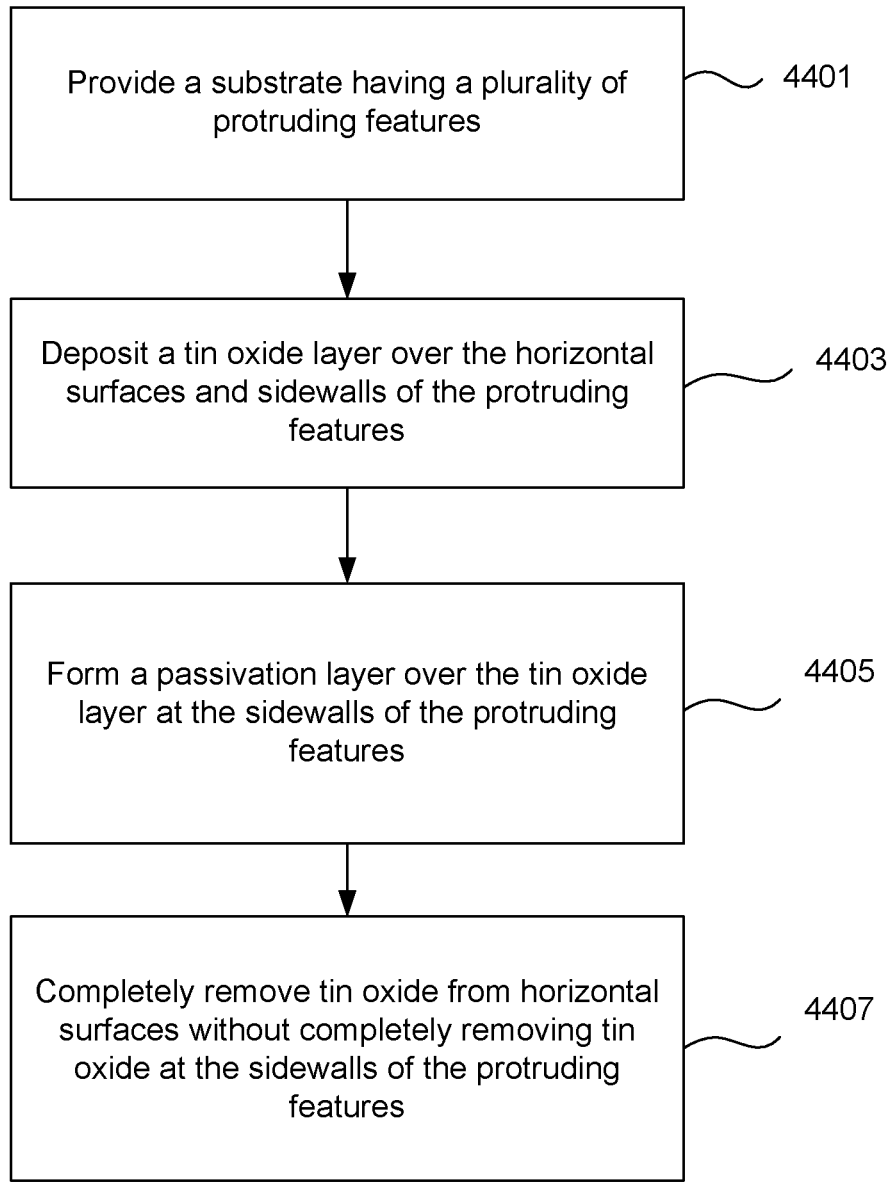
FIG. 4 is a process flow diagram for a method of forming tin oxide spacers according to an embodiment provided herein.

FIGS. 3A-3E provide schematic cross-sectional view of a portion of the substrate during processing using passivation layer. FIG. 4 provides a process flow diagram for such process. Referring to FIG. 4, the process starts in 4401 by providing a substrate having a plurality of protruding features and proceeds in 4403 by depositing tin oxide on sidewalls and horizontal surfaces of the protruding features, in the same way as it was described with reference to FIGS. 1A and 1B. The substrate shown in FIG. 1B is also illustrated in FIG. 3A, where the target layer is layer 301, the ESL is 303, the mandrel is 305, and the tin oxide layer is 307. The materials of the layers generally may be the same as in the embodiment described with reference to FIGS. 1A-1F. In the embodiment illustrated in FIG. 3A the mandrel 305 is a silicon (Si) mandrel having an outer layer of silicon oxide ($SiO_2$) 302, but it is understood that the described process sequence can be used with a variety of mandrel materials including carbon-containing mandrels and metal oxide mandrels. Referring to FIG. 4, after the tin oxide layer has been deposited, the process follows in 4405 by forming a passivation layer over the tin oxide layer at the sidewalls of the protruding features. The resulting structure is shown in FIG. 3B, which shows the passivation layer 309 on the sidewalls of the protruding feature. In the depicted embodiment the passivation layer is not present on the horizontal surfaces.

Such passivation layer can be formed in some embodiments by first (a) conformally depositing the passivation material (e.g., silicon oxide, silicon nitride, silicon carbide, or carbon) over both the sidewalls and the horizontal surfaces of the mandrel and then (b) completely removing the passivation layer from horizontal surfaces without completely removing the passivation layer from the sidewalls (e.g., such that at least 50, or at least 80% of the passivation layer material at the sidewall remains after etch).

When the passivation material is a silicon-containing compound, it can be etched from the horizontal surfaces using a fluorocarbon-based etch selectively to tin oxide. When the passivation material is a carbon-containing material it can be removed from horizontal surfaces using an oxygen-based etch selectively to tin oxide, or using a short exposure to a plasma formed in a hydrogen-containing gas (e.g. $H_2$). Tin-containing passivation materials, in some embodiments are removed from horizontal surfaces using the same chemistry as used for tin oxide etching, with the use of a sufficient bias at the substrate that facilitates removal of material from horizontal surfaces. For example, the process may start with a plasma etch with a first bias to remove tin-containing passivation material from the horizontal surfaces and then the bias may be reduced or turned off as the process transfers to main tin oxide etch. In some embodiments a chlorine-based chemistry (e.g., $BCl_3/Cl_2$ plasma) is used during etching of passivation material and tin oxide from the horizontal surfaces.

Next, referring to operation 4407 the process follows by completely removing tin oxide from the horizontal surfaces of the mandrel without completely removing the tin oxide at the sidewalls of the mandrel. This etch can be performed using any of the suitable tin oxide etch chemistries described herein, such as using a hydrogen-based etch (e.g., $H_2$ plasma), a chlorine-based etch (e.g., $Cl_2$ and/or $BCl_3$ in a plasma), HBr plasma etch or any combination of these etches. In the embodiment depicted in FIGS. 3C and 3D this etch is performed in two steps. In a first step, the bulk of the tin oxide is etched from horizontal surfaces using a chlorine-based etch (e.g., $BCl_3$ and $Cl_2$ in a plasma) to provide a structure shown in FIG. 3C, where the structure has an exposed silicon oxide outer mandrel material at the top of the mandrel and an excess of tin oxide at the bottom corners of the mandrel. Next, the excess tin oxide is etched with a hydrogen-based overetch chemistry (e.g., $H_2$ in a plasma) providing a structure shown in FIG. 3D. Next the mandrel material is selectively etched and removed, as was previously described with reference to FIGS. 1A-1F, leaving the spacers 307. In the depicted embodiment the mandrel etch chemistry also removes the passivation layer 309, leading to a structure shown in FIG. 3E. Subsequent processing of the ESL can follow as was previously described with reference to FIGS. 1D-1F.

In one more specific example, layer 301 is TiN, the ESL 303 is a silicon oxide layer; the mandrel 305 is silicon (Si) covered with silicon oxide outer layer 302, and layer 307 is tin oxide. In reference to this example, the processing method includes: providing a substrate having a silicon oxide layer, and a plurality of silicon protrusions, where the silicon protrusions are covered with native silicon oxide, followed by depositing a tin oxide layer conformally over the substrate (e.g., by ALD) and forming a silicon oxide passivation layer (e.g., 1-2 nm thick) only over tin oxide on the sidewalls of the protruding features. After the passivation layer was formed, the method follows by etching tin oxide from horizontal surfaces without completely removing tin oxide residing at the sidewalls of the protruding features. In this example, the etching is conducted using a main (bulk) etch (e.g., $Cl_2/BCl_3$ plasma etch) followed by overetch, where the overetch may be, for example a hydrogen plasma etch that is used to reduce footing. After etching the method continues by removing the silicon mandrels without removing the tin oxide spacers. It is noted that the silicon oxide passivation layer on the sidewalls can be formed by first conformally depositing silicon oxide over tin oxide (e.g., by PECVD, or ALD), and then selectively etching silicon oxide from horizontal surfaces (e.g., by fluorocarbon plasma). This sequence was experimentally tested using $BCl_3/Cl_2$ plasma main etch followed by $H_2$ plasma overetch for tin oxide removal from horizontal surfaces. In this experimentally tested example, after the main etch, the critical dimension loss was zero nm; the footing was about 6 nm, and the amount of etch into silicon oxide ESL is zero nm. After the overetch, the critical dimension loss, the footing, and the amount of etch into silicon oxide ESL were all zero nm.

In another specific example, tin nitride formed from an outer portion of the tin oxide is used as a passivation material. In some embodiments, it is preferable to passivate the sidewalls of tin oxide using a tin nitride passivation layer during formation of tin oxide spacers, and thereby reduce the variation in the spacer. In some embodiments the method includes: (a) providing a substrate having a silicon oxide layer, and a plurality of silicon protrusions, where the silicon protrusions are covered with native silicon oxide; (b) depositing a tin oxide layer conformally over the substrate (e.g., by ALD); (c) forming a thin tin nitride passivation layer only over tin oxide on the sidewalls of the protruding features; (d) etching tin oxide from horizontal surfaces without completely removing tin oxide residing at the sidewalls of the protruding features (e.g., using a combination of a main (bulk) etch (e.g., $Cl_2/BCl_3$ etch) and overetch, where the overetch may be, for example hydrogen plasma etch that is used to reduce footing); and (e) removing the silicon mandrels without removing the tin oxide spacers. The tin nitride passivation layer on the sidewalls can be formed by first conformally forming the passivation layer over the entire tin oxide layer, followed by selectively removing tin oxide from horizontal surfaces. In some embodiments tin nitride layer is formed by treating the exposed tin oxide layer with a nitrogen-containing plasma. For example, the plasma may be formed in a nitrogen-containing gas, such as $N_2$ or $NH_3$. The plasma may be direct (formed in the same chamber compartment that houses the substrate) or remote (formed in a different chamber or chamber compartment and fed to the compartment housing the substrate). In some embodiments this nitridation treatment is performed in the same process chamber that is used for tin oxide layer deposition. In other embodiments, nitridation is performed in a different chamber. In some embodiments, the nitridizing plasma treatment is performed for less than about 5 seconds. Another method for forming a conformal layer of tin nitride is deposition of tin nitride over the conformal tin oxide layer. Tin nitride can be deposited, for example, by ALD or CVD. In some embodiments, ALD deposition involves contacting the substrate with a tin-containing precursor and forming a tin-containing layer on the surface of the substrate, followed by treatment with a nitrogen-containing plasma, where the process is repeated as many times as necessary to build a passivation layer of desired thickness. After the conformal tin nitride layer has been formed, tin nitride is etched from horizontal surfaces leaving tin nitride only on the sidewalls. In some embodiments, the chemistry of this etch is the same as the chemistry of the main etch, but it is carried out using substrate bias, such that it is more vertically anisotropic than the main etch. For example, tin nitride can be removed from horizontal surfaces using $Cl_2/BCl_3$ plasma etch with substrate bias. Next, the $Cl_2/BCl_3$ main etch follows (e.g., with no substrate bias or with lower bias than that used during tin nitride removal from horizontal surfaces), which is then followed by $H_2$ overetch. Tin nitride provides an excellent protection to tin oxide at the sidewalls during the main etch process. The use of tin nitride as a passivation layer has been experimentally tested and it was confirmed that the thickness of tin oxide on the sidewalls of mandrels is greater in those cases, where tin nitride passivation layer was used, than in identical structures processed without tin oxide nitridation.

Hardmask Applications

In some embodiments, tin oxide films are used as hardmasks. Tin oxide hardmasks can be patterned such as to form a substrate having recessed features, where there is an exposed material at the bottoms of the recessed features. The substrate then can be processed in a presence of the tin oxide hardmask. In some embodiments processing involves etching the material exposed at the bottoms of the recessed features. In other embodiments, processing may involve depositing a material into the recessed features. In other embodiments, processing may involve chemically modifying the material exposed at the bottoms of the recessed features.

Patterned tin oxide layers can be formed using a variety of methods. In one embodiment patterned tin oxide film is formed using photolithographic patterning. The method involves, in one embodiment, providing a substrate having a blanket tin oxide layer formed on a substrate and forming a patterned photoresist layer over the blanket tin oxide layer. The patterned photoresist layer over the tin oxide layer in some embodiments is formed directly on top of and in contact with the tin oxide layer. In other embodiments, there may be one or more intermediate hardmask layers between the layer of tin oxide and photoresist. After the photoresist layer has been deposited and patterned using standard photolithographic techniques, the pattern from the photoresist is transferred onto the tin oxide layer, i.e. the exposed tin oxide layer is etched. In some embodiments the tin oxide layer is etched in a presence of exposed photoresist using a selective etch, such as a hydrogen-based etch (e.g., $H_2$ in a plasma). When intermediate hardmasks are present between the layer of tin oxide and photoresist, the pattern from the photoresist is first transferred to these intermediate hardmasks (e.g., mask containing a silicon-containing compound such as spin-on glass, or a carbon mask) and then to tin oxide. In some embodiments the tin oxide layer is etched in a presence of another intermediate hardmask material (e.g., a silicon-containing compound or carbon) using a suitable selective chemistry, such as hydrogen-based etch and/or chlorine-based etch.

Figure 5A:
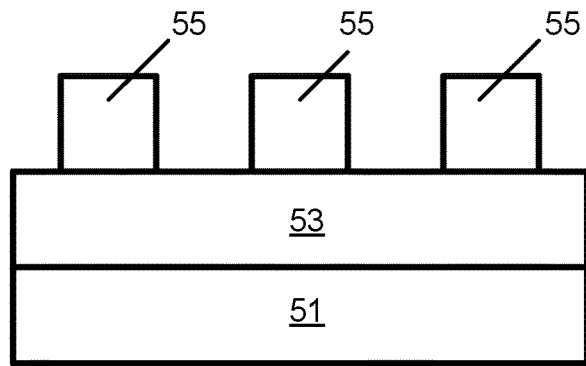
FIGS. 5A-5C show schematic cross-sectional views of a semiconductor substrate undergoing processing according to an embodiment provided herein.
Figure 5B:
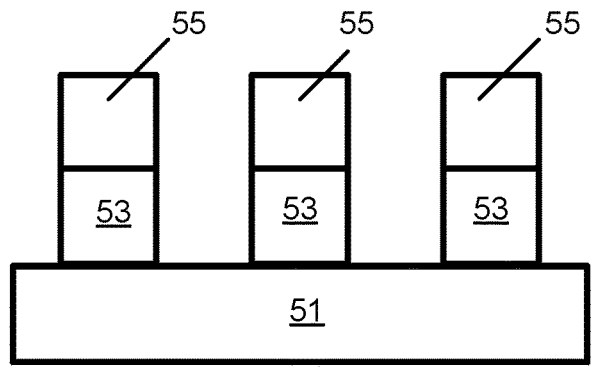
Figure 5C:
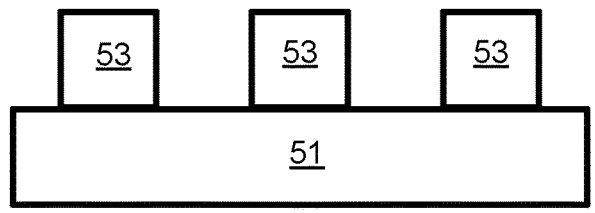
Figure 6:
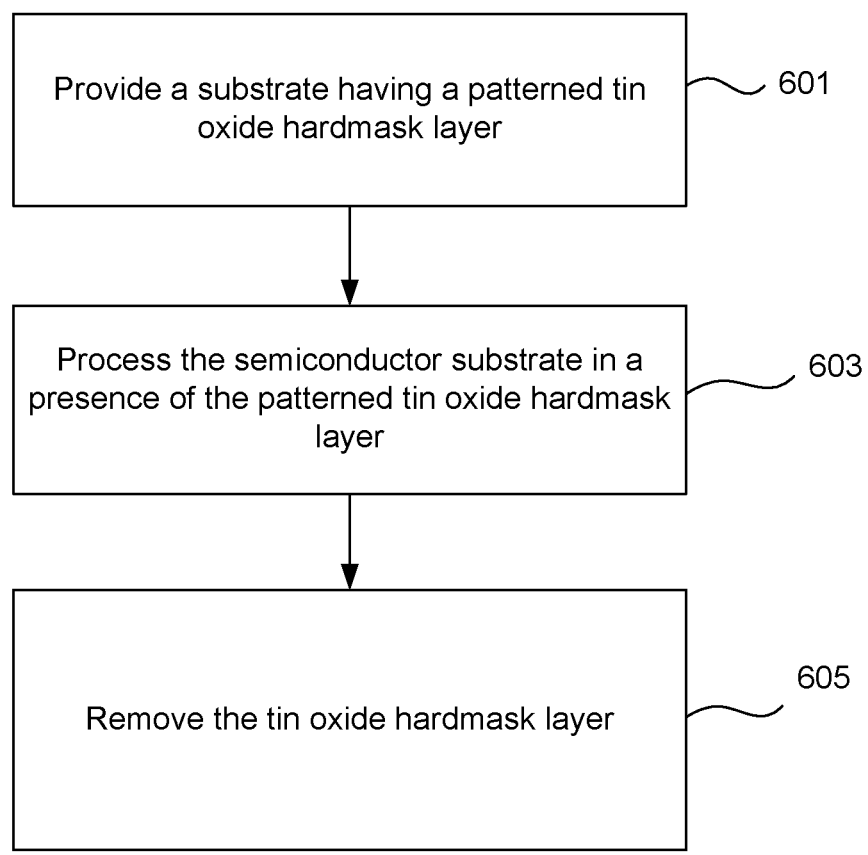
FIG. 6 is a process flow diagram for a method of semiconductor according to an embodiment provided herein.

FIGS. 5A-5C illustrate schematic cross-sectional views of a substrate undergoing processing with a tin oxide mask. FIG. 6 provides a process flow diagram for processing the substrate with a tin oxide hardmask. In operation 601, a substrate having patterned tin oxide layer is provided. The tin oxide layer may be patterned using photolithographic techniques as described above or using the process sequence that is used to form tin oxide spacers, that was described with reference to FIG. 1A-1D. An example of such substrate is shown in FIG. 5A, where the substrate includes a sublayer 51, and a layer 53, which resides between the sublayer 51 and the patterned tin oxide layer 55. The exposed portion of the substrate includes recessed features formed in the tin oxide layer 55. The material of layer 53 is exposed at the bottoms of the recessed features. While in the depicted embodiment there is no additional material on the top of patterned tin oxide layer 55, in other embodiments there may be photoresist or material from intermediate hardmasks present on top of tin oxide 55.

Next, in operation 603, the substrate is processed in a presence of the tin oxide layer 55. Processing may involve, for example, etching of the exposed material 53, deposition of material into the recessed features, or chemical modification of the exposed material 53. Etching of material 53 is illustrated in FIG. 5B, where recessed features defined by the pattern of the tin oxide layer 55 are formed in layer 53. A variety of selective etch chemistries can be used for etching the material of layer 53 in a presence of tin oxide 55. For example, when layer 53 is a silicon-containing material, it may be selectively etched in a presence of tin oxide using a fluorine-based chemistry. For example, silicon-containing compounds, such as silicon oxide, silicon nitride and silicon carbide can be etched using a fluorocarbon plasma chemistry. When layer 53 is a carbon-containing layer (e.g., amorphous carbon), it may be selectively etched using an oxygen-based chemistry, as described herein. When layer 53 is a metal oxide layer (e.g., titanium oxide, zirconium oxide, tantalum oxide, hafnium oxide), it may be selectively etched in a presence of tin oxide using a chlorine-based chemistry, as described herein (e.g., $BCl_3/Cl_2$ in a plasma). The material of the sublayer 51 is different from the material of layer 53, and layer 51 is not substantially etched during the etching of layer 53. The resulting structure, shown in FIG. 5B has recessed features formed in layer 55 and 53 and an exposed material of sublayer 51 at the bottoms of the recessed features.

Next, in operation 605 the tin oxide material 55 is removed providing a structure shown in FIG. 5C, where a patterned layer 53 resides over sublayer 51. In some embodiments, this sequence is further used to pattern sublayer 51, which is in some embodiments a SiN layer, a metal nitride (e.g., TiN, or TaN), or metal layer. Removal of tin oxide is preferably performed using a chemistry that is selective to both the material of layer 53 and layer 51. For example, when these materials are silicon-containing materials, carbon-containing materials, metal oxides, metal nitrides, or metals a selective hydrogen-based etch (e.g., $H_2$ plasma etch may be used). Further, in some embodiments when materials of layer 53 and 51 are silicon-containing materials or carbon-containing materials a chlorine-based etch (e.g., $BCl_3/Cl_2$ in a plasma) may be employed.

In one specific example of a process flow that uses a tin oxide hardmask, the sublayer 51 is a SiN layer, or a metal layer, and layer 53 is silicon oxide. The process starts by providing a planar substrate having an exposed layer of silicon oxide over the SiN or metal layer 51. Next, a blanket tin oxide layer is deposited over silicon oxide, and tin oxide is then patterned (e.g., using photolithographic patterning), leading to a structure shown in FIG. 5A. Next, exposed silicon oxide is selectively etched relative to tin oxide, for example, using fluorocarbon plasma, leading to a structure shown to FIG. 5B. Next, tin oxide is stripped (removed), for example, using a hydrogen plasma etch, leading to a structure shown in FIG. 5C.

Tin Oxide Middle Layer.

Figure 5D:
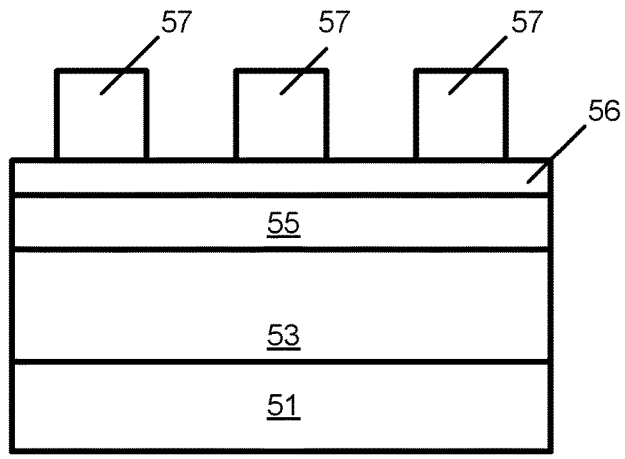
FIGS. 5D-5G show schematic cross-sectional views of a semiconductor substrate undergoing processing according to another embodiment provided herein.
Figure 5E:
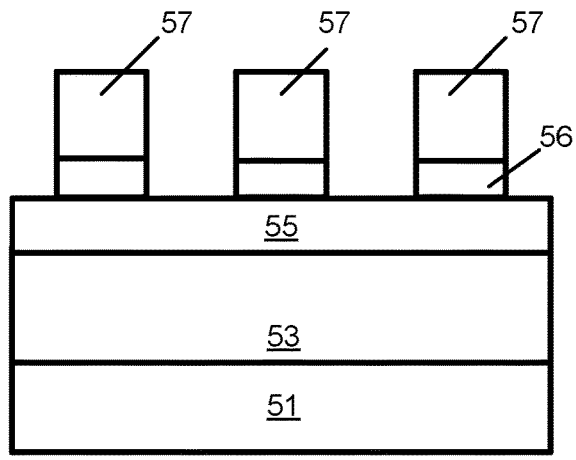
Figure 5F:
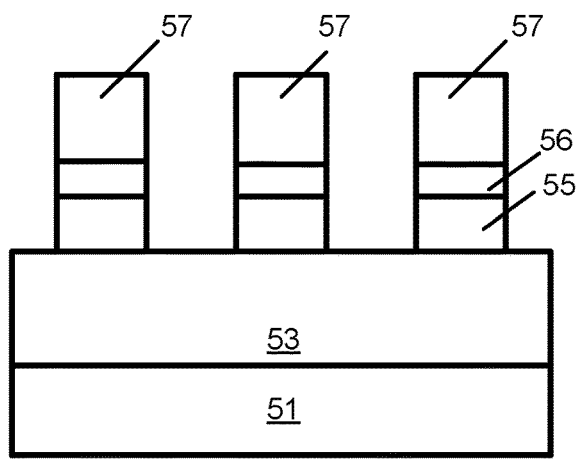
Figure 5G:
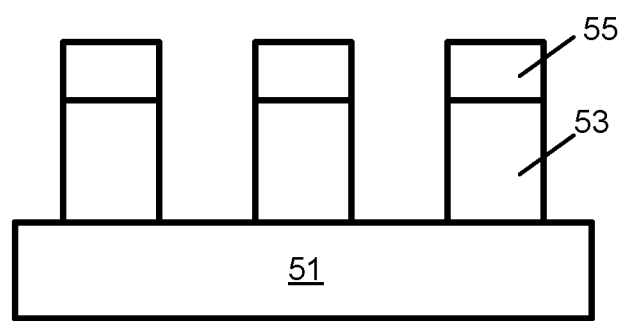

In another hardmask implementation, tin oxide is used as an intermediate hardmask (middle layer) for patterning of a carbon layer or another material. In one embodiment, a substrate is provided, where the substrate includes a patterned layer of tin oxide formed on a carbon-containing layer (e.g., on an amorphous carbon layer), wherein the substrate includes a plurality of recessed features having an exposed carbon-containing material at the bottoms of the recessed features. Next the exposed carbon-containing material is selectively etched in a presence of tin oxide to form recessed features in the carbon-containing layer. Suitable selective etch chemistries include hydrogen-based etch chemistry (e.g., $H_2$ in a plasma, and HBr in a plasma) and chlorine-based etch chemistry (e.g., $BCl_3$ and/or $Cl_2$ in a plasma). One suitable process sequence is illustrated by cross-sectional substrate views shown in FIGS. 5D-5G. The substrate shown in FIG. 5D includes a sublayer 51 (e.g., amorphous silicon or any of the target layers described herein), a blanket layer 53 of a carbon-containing material (e.g., amorphous carbon) residing over sublayer 51 and a blanket tin oxide layer 55 residing over carbon-containing layer 53. The substrate further includes a patterned photoresist layer 57 over the tin oxide layer 55, and an underlayer 56 between the photoresist 57 and the tin oxide layer 55, where the underlayer may be, for example, spin on glass. The underlayer 56 is exposed at the bottoms of the recessed features formed in the patterned photoresist layer 57 on the surface of the substrate. The pattern of the photoresist is transferred to the underlayer 56, by selectively etching the underlayer in a presence of photoresist, e.g., by a fluorocarbon-based plasma etch. The etch exposes the tin oxide layer 55 at the bottoms of the recessed features, as shown in FIG. 5E. Next, tin oxide is patterned using an etch that is preferably selective to the underlayer material. For example, tin oxide may be etched using a hydrogen-based etch or a chlorine-based etch. In the resulting structure shown in FIG. 5F, the pattern has been transferred from photoresist to the tin oxide layer and the carbon-containing layer 53 is exposed at the bottoms of recessed features. Next, the process follows by etching the exposed carbon-containing layer 53. Preferably, a chemistry that is selective to tin oxide is used. For example, the exposed carbon-containing layer 53 may be etched by an oxygen-based etch (e.g., carbon can be etched by a plasma formed in an oxygen-containing gas). The remaining photoresist and underlayer 56 may also be removed in this step. The structure obtained after this etch is shown in FIG. 5G. The process may further follow by removal of tin oxide 55 and subsequent processing of the exposed sublayer 51.

Another implementation of the middle layer embodiment is shown in FIGS. 5H-5K. The sequence is similar to the one described with reference to FIGS. 5D-5G, but is performed without an underlayer 56. In this sequence the patterned photoresist 57 is formed directly on the tin oxide layer 55, which is followed by tin oxide etch in a presence of photoresist (e.g., using a hydrogen-based etch ($H_2$ or HBr)) or a chlorine-based etch. The process then follows to transfer the pattern from the tin oxide middle layer 55 to the carbon-containing layer 53, where the layer 53 may itself serve as a hardmask for patterning the underlying layer 51. Next, the tin oxide 55 is selectively etched and removed in a presence of carbon-containing layer 53, e.g., using a hydrogen-based etch chemistry (e.g., $H_2$ in a plasma). These middle layer sequences are suitable for EUV hardmask processing applications.

Figure 5H:
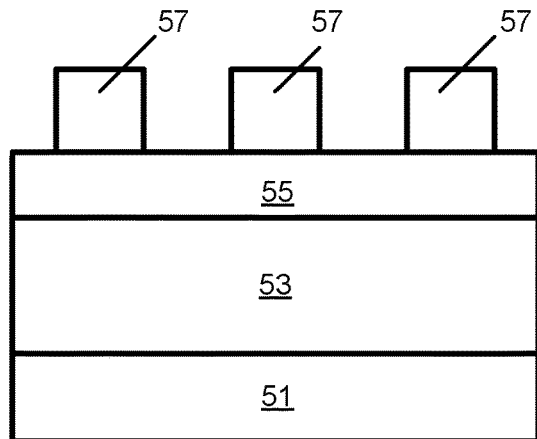
FIGS. 5H-5K show schematic cross-sectional views of a semiconductor substrate undergoing processing according to another embodiment provided herein.
Figure 5I:
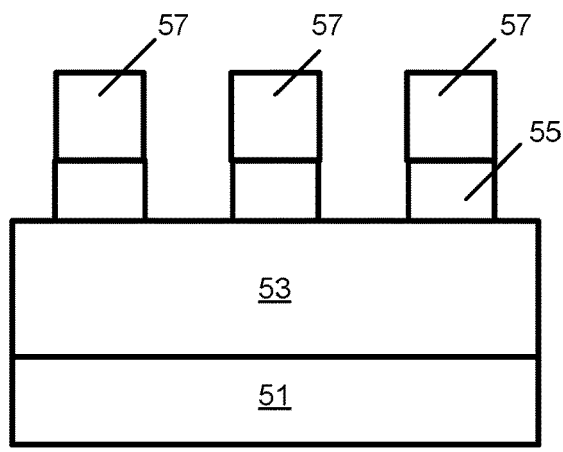
Figure 5J:
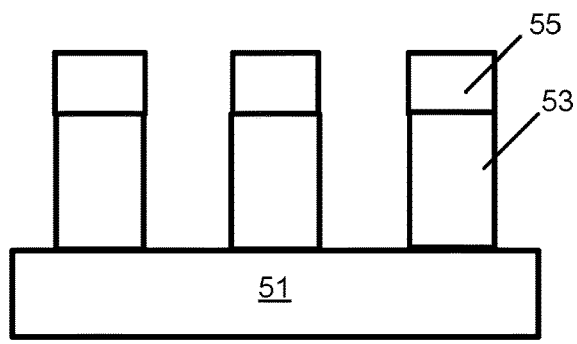
Figure 5K:
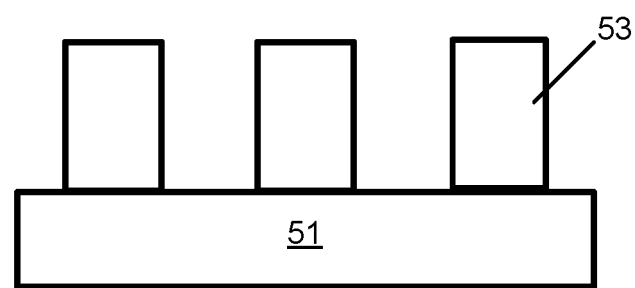

In another embodiment, a highly selective etch is used to transfer the photoresist pattern to the tin oxide layer. For example tin oxide can be electively etched in a presence of overlying photoresist and an underlying material using a hydrogen-based etch chemistry, with an addition of a carbon-containing reactant, where the carbon containing reactant is used to form a carbon-containing polymer on the surface of the substrate and increase etch selectivity. For example, plasma may be formed in a mixture of $H_2$, hydrocarbon (e.g., $CH_4$), and, optionally an inert gas, as described herein. This will be illustrated with reference to FIGS. 5H-5K. In this example, as shown in FIG. 5H, a patterned layer of photoresist 57 is formed over the tin oxide layer 55 (e.g., 9-12 nm thick). The layer of material directly underlying the tin oxide layer, in this illustration, is a tungsten carbon layer 53 (35-55 nm thick). The layer 51 in this illustration is silicon oxide (e.g., TEOS cap), which may reside on a layer of extreme low k dielectric used in BEOL process sequence. First, tin oxide is selectively etched in a presence of the photoresist and tungsten carbon using the highly selective $H_2/CH_4$ plasma etch. The recessed features are formed and the tungsten carbon layer is exposed, as shown in FIG. 5I. Next, tungsten carbon is selectively etched in a presence of tin oxide, exposing the underlying TEOS layer. For example, tungsten carbon can be etched selectively relative to tin oxide using an $NF_3/Cl_2$ plasma etch described herein. The photoresist may also be substantially removed during this step. The resulting structure is shown in FIG. 5J. Next, the tin oxide is removed from the substrate using an etch that is selective to carbon tungsten. In some embodiments it is preferable to remove tin oxide using $H_2$ plasma. In some embodiments hydrocarbon additives are not used during this step. For example tin oxide can be removed after the underlying layer has been etched using $H_2$ etch under the following process conditions. In this example the etch involves flowing $H_2$ at a flow rate of 100-500 sccm, and forming a plasma in this process gas using RF power of 100-500 W (per one 300 mm wafer). This etch can be conducted with or without a substrate bias. For example, substrate bias may be between 0-100 Vb, such as 10-100 Vb. The process can be performed at a temperature of less than 100° C. and a pressure of 5-50 mTorr.

Figure 5L:
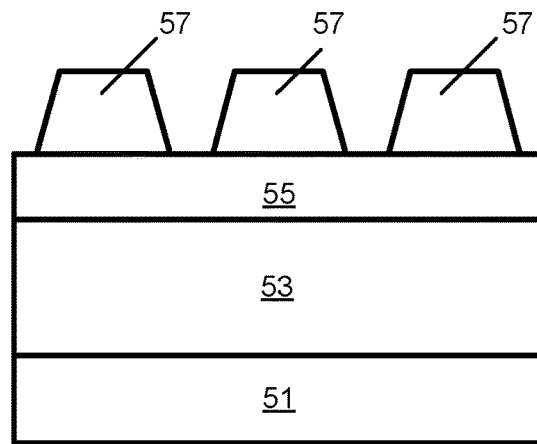
FIGS. 5L-5O show schematic cross-sectional views of a semiconductor substrate undergoing processing according to another embodiment provided herein.
Figure 5M:
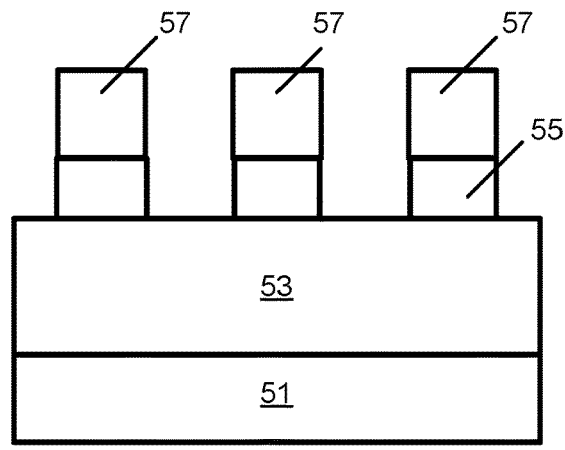
Figure 5N:
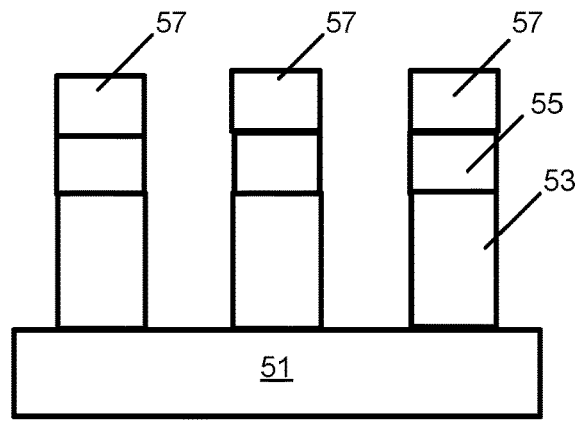
Figure 5O:
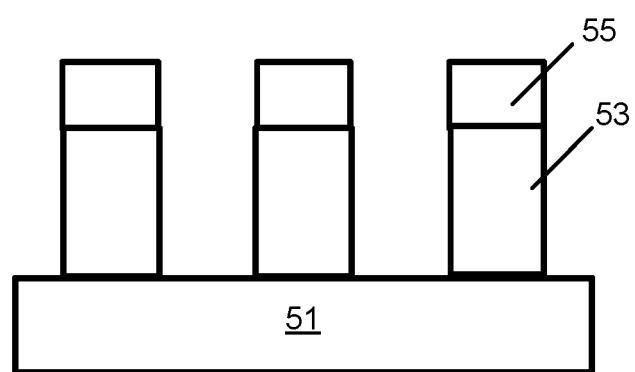

Another process flow with a tin oxide middle layer hardmask is illustrated by the cross-sectional views in FIGS. 5L-5O. In this example, as shown in FIG. 5L, a patterned layer of photoresist 57 is formed over the tin oxide layer 55 (e.g., 9-12 nm thick). The layer of material directly underlying the tin oxide layer, in this illustration, is an amorphous silicon (Si) layer 53 (35-55 nm thick). The layer 51 in this illustration is a silicon oxide etch stop layer. In this illustration the photoresist is deposited such that it is wider at the bottom than at the top. It was shown that with the use of the $H_2$/hydrocarbon plasma etch it is possible to reduce the difference in photoresist width and make it substantially rectangular in cross-section. First, tin oxide is selectively etched in a presence of the photoresist and amorphous silicon using the highly selective $H_2/CH_4$ plasma etch. The recessed features are formed and the amorphous silicon layer is exposed, while the geometry of photoresist is improved, as shown in FIG. 5M. Next, silicon is selectively etched in a presence of tin oxide, exposing the underlying etch stop layer. For example, silicon can be etched selectively relative to tin oxide using $NF_3/Cl_2$ plasma etch described herein. The etch selectivity of greater than 40 (silicon to tin oxide) can be achieved with this etch. The photoresist may also be partially removed during this step. The resulting structure is shown in FIG. 5N. Next, the tin oxide is removed from the substrate using an etch that is selective to silicon. In some embodiments it is preferable to remove tin oxide using $H_2$ plasma. The remaining photoresist 57 can be removed during $H_2$ plasma treatment. The resulting structure is shown in FIG. 5O.

The use of tin oxide as a hardmask is highly advantageous because it can be etched with very high selectivity relative to silicon oxide, which is a common layer to be patterned. It can also be selectively etched with a dry plasma etch chemistry (e.g., hydrogen-based or chlorine-based chemistry) to a wide variety of other materials, including carbon, photoresist, metals, metal nitrides, and metal oxides. Tin oxide hardmasks also compare favorably to titanium nitride hardmasks because tin oxide does not require wet etching and can be etched with hydrogen plasma, whereas titanium nitride is typically removed by wet etching methods.

Figure 7A:
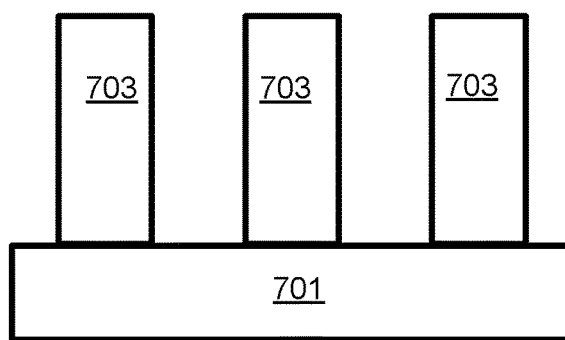
FIGS. 7A-7C show schematic cross-sectional views of a semiconductor substrate undergoing processing according to an embodiment provided herein.
Figure 7B:
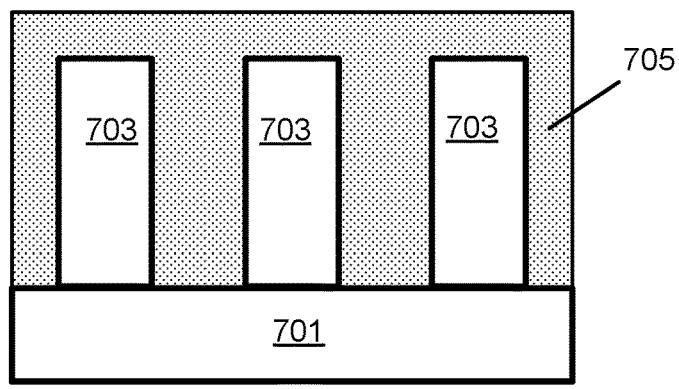
Figure 7C:
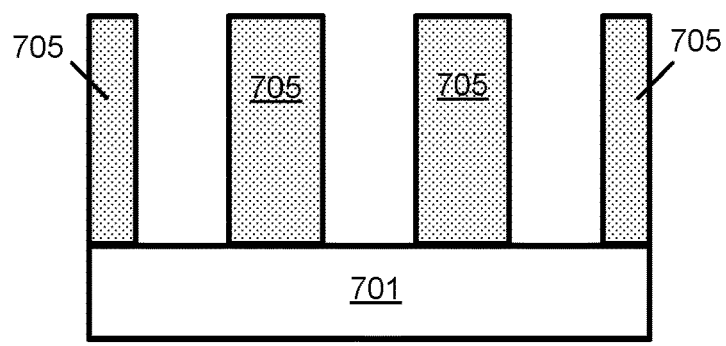
Figure 8:
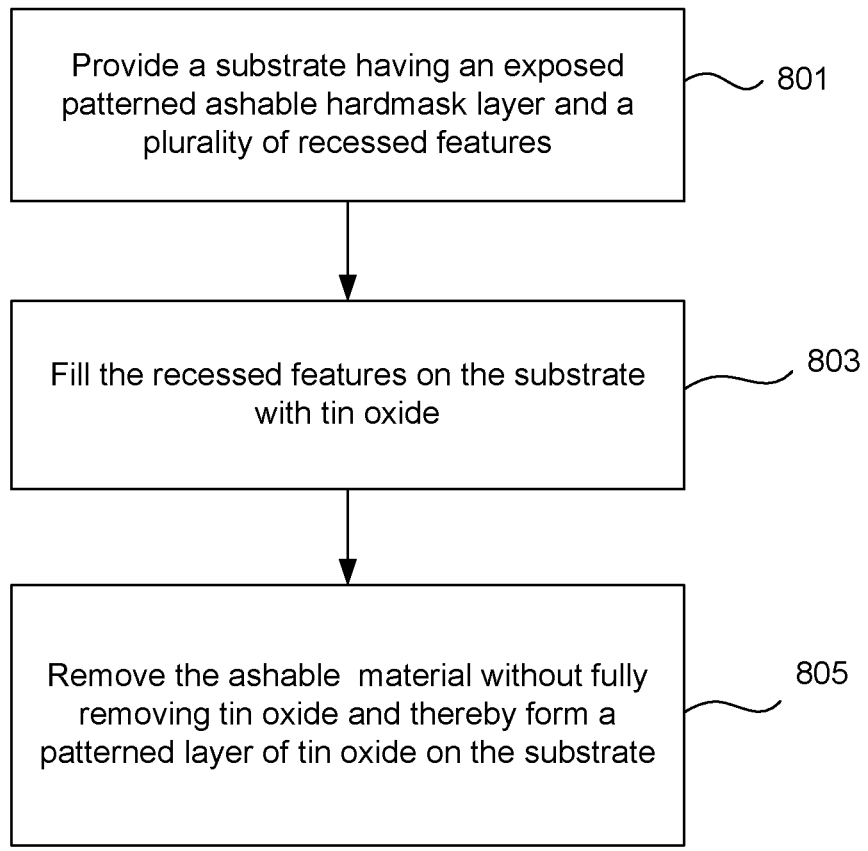
FIG. 8 is a process flow diagram for a method according to an embodiment provided herein.

Reverse tone hardmasks. In some embodiments, tin oxide is used in various reverse tone hardmasks applications. One exemplary process flow is shown in FIG. 8 and is illustrated by schematic cross-sectional views of a substrate in FIGS. 7A-7C. The process starts in 801 by providing a substrate having an exposed patterned ashable layer and a plurality of recessed features. Examples of ashable materials include carbon-containing materials such as amorphous carbon, diamond-like carbon, photoresist and organic polymers where the polymers may be undoped or doped with metals or metal oxides. The patterned layer of ashable material can be formed, for example, by depositing a blanket layer of ashable material (e.g., by PECVD or a spin on method), followed by photolithographic patterning. FIG. 7A illustrates a substrate having a patterned layer of ashable material 703 residing on a sublayer 701 (e.g., Si, SiN, metal nitride or any target or sublayer material described herein). There is a plurality of recessed features on the substrate and layer 701 is exposed at the bottoms of the recessed features. Next, in operation 803, the recessed features on the substrate are filled with tin oxide (e.g., using CVD). An overburden is also typically formed over the layer of the ashable material 703 in this step. The obtained structure is shown in FIG. 7B, where the deposited tin oxide 705 fills the gaps between the ashable material 703 and forms an overburden. The overburden can then be removed, e.g, by a chemical mechanical polishing (CMP) operation or a bulk plasma etch (e.g., using a hydrogen-based and/or chlorine-based plasma etch) to expose the ashable material 703. After planarization, in operation 805, the ashable material is removed without substantially removing the tin oxide material (e.g., at least 90% of tin oxide remains) thereby forming a complementary pattern of tin oxide 705 as shown in FIG. 7C.

In one specific example, a substrate containing a patterned carbon layer residing on a target layer (e.g., silicon oxide, silicon nitride or a metal) is provided. The patterned carbon layer has a plurality of recesses (e.g., with widths of between about 5-50 nm). Next, the recesses are filled with tin oxide and a tin oxide overburden is formed (e.g., CVD). Next, tin oxide overburden is removed (e.g., by CMP or a dry plasma etch that is selective to carbon) to expose carbon, and then the carbon is removed (stripped) e.g., using $O_2$ plasma, without completely removing the tin oxide.

Figure 9A:
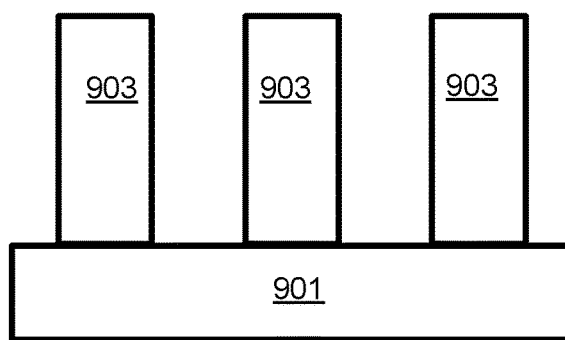
FIGS. 9A-9C show schematic cross-sectional views of a semiconductor substrate undergoing processing according to an embodiment provided herein.
Figure 9B:
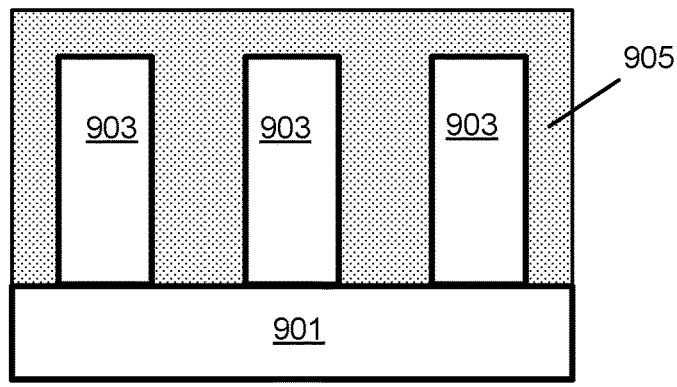
Figure 9C:
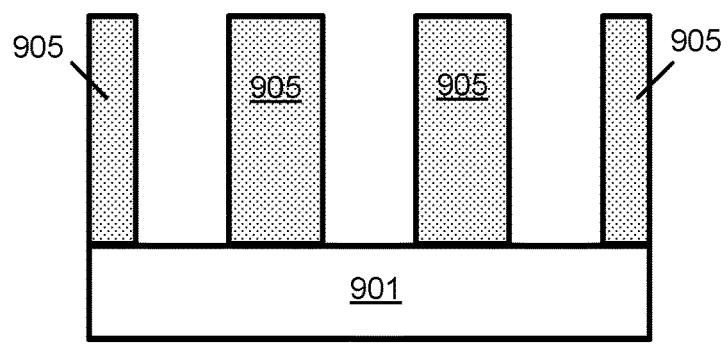
Figure 10:
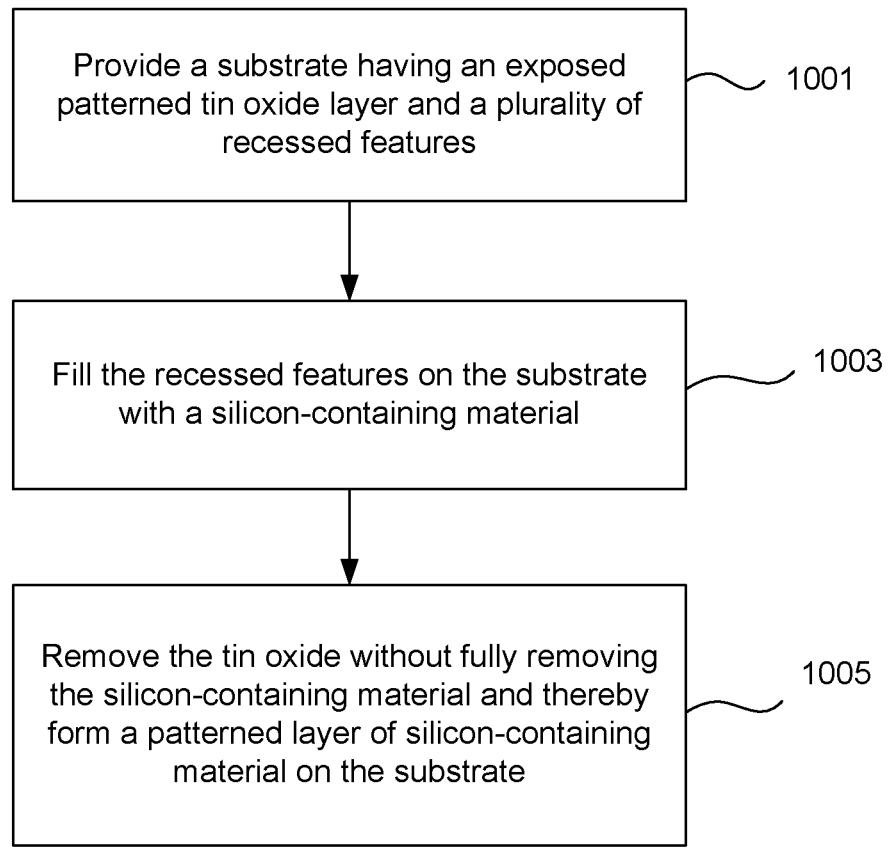
FIG. 10 is a process flow diagram for a method according to an embodiment provided herein.

Another embodiment of a reverse tone mask implementation is shown in a process flow diagram in FIG. 10 and is illustrated by schematic cross-sectional view of the processed substrate in FIGS. 9A-9C. The process starts in 1001 by providing a substrate having a patterned tin oxide layer and a plurality of recessed features. This is illustrated in FIG. 9A, where the patterned tin oxide layer 903 resides on a sublayer 901 (e.g., metal nitride, or metal layer), The sublayer 901 is exposed at the bottoms of the recessed features formed in the tin oxide layer 903. Next, in operation 1003, the recessed features are filled by a silicon-containing material, e.g., by CVD. Examples of suitable silicon-containing materials include silicon (e.g., amorphous silicon or polysilicon) and silicon-containing compounds, such as silicon oxide, silicon nitride, and silicon carbide. An overburden over the tin oxide layer may be formed during this deposition. The resulting structure is shown in FIG. 9B, where the silicon-containing material 905 fills the gaps in the patterned tin oxide layer and forms an overburden. Next, the overburden is removed by CMP or by a plasma etch (e.g., a fluorine-based etch, such as a fluorocarbon plasma etch) and the tin oxide 903 is exposed. In the next operation 1005 the tin oxide is removed without removing the silicon-containing material thereby forming a patterned layer of silicon-containing material (reverse tone or complementary pattern to the tin oxide pattern). The tin oxide is etched selectively to the silicon-containing material, for example, using a hydrogen-based etch (e.g., $H_2$ plasma etch, or HBr plasma etch) or a chlorine-based etch (e.g., $BCl_3/Cl_2$ etch). The structure obtained after the etch is shown in FIG. 9C, where the patterned silicon-containing layer 905 is shown. The sublayer 901 is exposed at the bottoms of the recessed features formed in the silicon-containing material 905.

In one implementation, a substrate having a target layer with a patterned layer of tin oxide over the target layer, is provided. Next, the recessed features in the patterned tin oxide are filled with silicon oxide, and a silicon oxide overburden is formed (e.g., by PECVD). Next, the silicon oxide overburden is etched (recess etched) to expose tin oxide, and then tin oxide is removed (stripped), e.g., using hydrogen plasma, thereby leaving patterned silicon oxide with a pattern that is complementary to the initial tin oxide pattern.

Apparatus

The etching methods described herein can be carried out in a variety of apparatuses. A suitable apparatus includes an etch process chamber, a substrate holder in the etch process chamber configured to hold the substrate in place during etching, and a plasma generating mechanism configured for generating a plasma in a process gas.

Examples of suitable apparatuses include inductively coupled plasma (ICP) reactors which, in certain embodiments, may also be suitable for cyclic deposition and activation processes, including atomic layer etching (ALE) operations and atomic layer deposition (ALD) operations. Although ICP reactors are described herein in detail, it should be understood that capacitively coupled plasma reactors may also be used.

Figure 11:
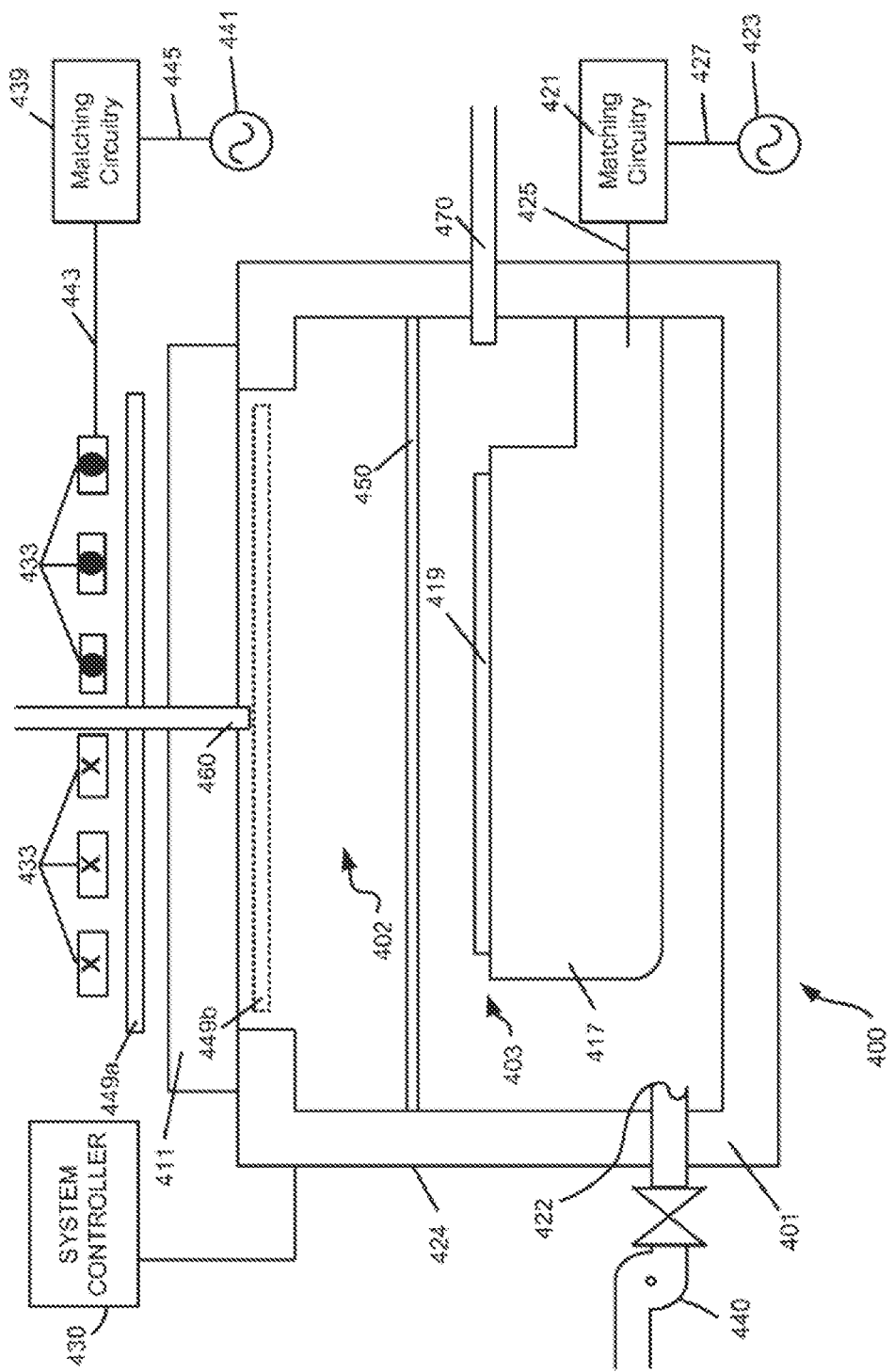
FIG. 11 is a schematic presentation of an apparatus that is suitable for etching tin oxide using etch chemistries provided herein.

FIG. 11 schematically shows a cross-sectional view of an inductively coupled plasma integrated etching and deposition apparatus 400 appropriate for implementing plasma etching described herein, an example of which is a Kiyo® reactor, produced by Lam Research Corp. of Fremont, CA The inductively coupled plasma apparatus 400 includes an overall process chamber 424 structurally defined by chamber walls 401 and a window 411. The chamber walls 401 may be fabricated from stainless steel or aluminum. The window 411 may be fabricated from quartz or other dielectric material. An optional internal plasma grid 450 divides the overall process chamber into an upper sub-chamber 402 and a lower sub-chamber 403. In most embodiments, plasma grid 450 may be removed, thereby utilizing a chamber space made of sub-chambers 402 and 403. A chuck 417 is positioned within the lower sub-chamber 403 near the bottom inner surface. The chuck 417 is configured to receive and hold a semiconductor wafer 419 upon which the etching and deposition processes are performed. The chuck 417 can be an electrostatic chuck for supporting the wafer 419 when present. In some embodiments, an edge ring (not shown) surrounds chuck 417, and has an upper surface that is approximately planar with a top surface of the wafer 419, when present over chuck 417. The chuck 417 also includes electrostatic electrodes for chucking and dechucking the wafer 419. A filter and DC clamp power supply (not shown) may be provided for this purpose. Other control systems for lifting the wafer 419 off the chuck 417 can also be provided. The chuck 417 can be electrically charged using an RF power supply 423. The RF power supply 423 is connected to matching circuitry 421 through a connection 427. The matching circuitry 421 is connected to the chuck 417 through a connection 425. In this manner, the RF power supply 423 is connected to the chuck 417. In various embodiments, a bias power of the electrostatic chuck may be set at about 50 Vb or may be set at a different bias power depending on the process performed in accordance with disclosed embodiments. For example, the bias power may be between about 20 Vb and about 100 Vb, or between about 30 Vb and about 150 Vb.

Elements for plasma generation include a coil 433 is positioned above window 411. In some embodiments, a coil is not used in disclosed embodiments. The coil 433 is fabricated from an electrically conductive material and includes at least one complete turn. The example of a coil 433 shown in FIG. 4 includes three turns. The cross-sections of coil 433 are shown with symbols, and coils having an "X" extend rotationally into the page, while coils having a "*" extend rotationally out of the page. Elements for plasma generation also include an RF power supply 441 configured to supply RF power to the coil 433. In general, the RF power supply 441 is connected to matching circuitry 439 through a connection 445. The matching circuitry 439 is connected to the coil 433 through a connection 443. In this manner, the RF power supply 441 is connected to the coil 433. An optional Faraday shield 449a is positioned between the coil 433 and the window 411. The Faraday shield 449a may be maintained in a spaced apart relationship relative to the coil 433. In some embodiments, the Faraday shield 449a is disposed immediately above the window 411. In some embodiments, the Faraday shield 449b is between the window 411 and the chuck 417. In some embodiments, the Faraday shield 449b is not maintained in a spaced apart relationship relative to the coil 433. For example, the Faraday shield 449b may be directly below the window 411 without a gap. The coil 433, the Faraday shield 449a, and the window 411 are each configured to be substantially parallel to one another. The Faraday shield 449a may prevent metal or other species from depositing on the window 411 of the process chamber 424.

Process gas (e.g. $H_2$ and He, etc.) may be flowed into the process chamber through one or more main gas flow inlets 460 positioned in the upper sub-chamber 402 and/or through one or more side gas flow inlets 470. Likewise, though not explicitly shown, similar gas flow inlets may be used to supply process gases to a capacitively coupled plasma processing chamber. A vacuum pump, e.g., a one or two stage mechanical dry pump and/or turbomolecular pump 440, may be used to draw process gases out of the process chamber 424 and to maintain a pressure within the process chamber 424. For example, the vacuum pump may be used to evacuate the lower sub-chamber 403 during a purge operation of A valve-controlled conduit may be used to fluidically connect the vacuum pump to the process chamber 424 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 400, one or more process gases such as an $H_2$-containing gas, may be supplied through the gas flow inlets 460 and/or 470. In certain embodiments, process gas may be supplied only through the main gas flow inlet 460, or only through the side gas flow inlet 470. In some cases, the gas flow inlets shown in the figure may be replaced by more complex gas flow inlets, one or more showerheads, for example. The Faraday shield 449a and/or optional grid 450 may include internal channels and holes that allow delivery of process gases to the process chamber 424. Either or both of Faraday shield 449a and optional grid 450 may serve as a showerhead for delivery of process gases. In some embodiments, a liquid vaporization and delivery system may be situated upstream of the process chamber 424, such that once a liquid reactant or precursor is vaporized, the vaporized reactant or precursor is introduced into the process chamber 424 via a gas flow inlet 460 and/or 470.

Radio frequency power is supplied from the RF power supply 441 to the coil 433 to cause an RF current to flow through the coil 433. The RF current flowing through the coil 433 generates an electromagnetic field about the coil 433. The electromagnetic field generates an inductive current within the upper sub-chamber 402. The physical and chemical interactions of various generated ions and radicals with the wafer 419 etch features of and selectively deposit layers on the wafer 419.

If the plasma grid 450 is used such that there is both an upper sub-chamber 402 and a lower sub-chamber 403, the inductive current acts on the gas present in the upper sub-chamber 402 to generate an electron-ion plasma in the upper sub-chamber 402. The optional internal plasma grid 450 limits the amount of hot electrons in the lower sub-chamber 403. In some embodiments, the apparatus 400 is designed and operated such that the plasma present in the lower sub-chamber 403 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 403 through port 422. For example, tin hydride generated during etching of tin oxide using $H_2$ plasma can be removed through port 422 during purging and/or evacuation. The chuck 417 disclosed herein may operate at elevated temperatures ranging between about 10° C. and about 250° C. The temperature will depend on the process operation and specific recipe. In some embodiments the apparatus is controlled to conduct the etching at a temperature of less than about 100° C.

Apparatus 400 may be coupled to facilities (not shown) when installed in a clean room or a fabrication facility. Facilities include plumbing that provide processing gases, vacuum, temperature control, and environmental particle control. These facilities are coupled to apparatus 400, when installed in the target fabrication facility. Additionally, apparatus 400 may be coupled to a transfer chamber that allows robotics to transfer semiconductor wafers into and out of apparatus 400 using typical automation.

In some embodiments, a system controller 430 (which may include one or more physical or logical controllers) controls some or all of the operations of a process chamber 424. The system controller 430 may include one or more memory devices and one or more processors. In some embodiments, the apparatus 400 includes a switching system for controlling flow rates of the process gases. The controller, in some embodiments, includes program instructions for causing the steps of any of the methods provided herein.

In some implementations, the system controller 430 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 430, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 430 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 430, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 430 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 430 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 12:
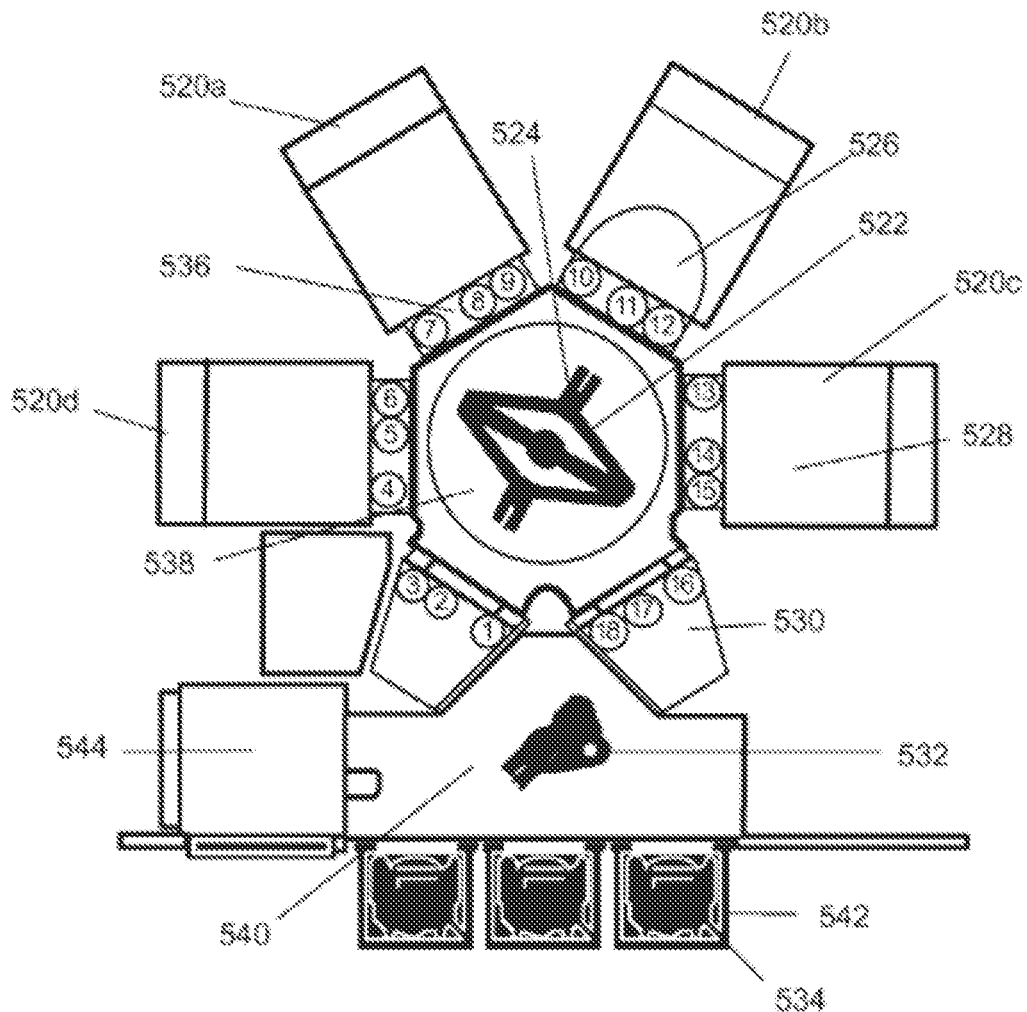
FIG. 12 shows a schematic view of a multi-station processing system according to an embodiment provided herein.

FIG. 12 depicts a semiconductor process cluster architecture with various modules that interface with a vacuum transfer module 538 (VTM). The arrangement of various modules to "transfer" wafers among multiple storage facilities and processing modules may be referred to as a "cluster tool architecture" system. Airlock 530, also known as a loadlock or transfer module, interfaces with the VTM 538 which, in turn, interfaces with four processing modules 520a-520d, which may be individual optimized to perform various fabrication processes. By way of example, processing modules 520a-520d may be implemented to perform substrate etching, deposition, ion implantation, wafer cleaning, sputtering, and/or other semiconductor processes. In some embodiments, tin oxide deposition and tin oxide etching are performed in the same module. In some embodiments, tin oxide deposition and tin oxide etching are performed in different modules of the same tool. One or more of the substrate etching processing modules (any of 520a-520d) may be implemented as disclosed herein, e.g., for depositing conformal films, selectively etching tin oxide, forming air gaps, and other suitable functions in accordance with the disclosed embodiments. Airlock 530 and processing modules 520a-520d may be referred to as "stations." Each station has a facet 536 that interfaces the station to VTM 538. Inside each facet, sensors 1-18 are used to detect the passing of wafer 526 when moved between respective stations.

Robot 522 transfers wafer 526 between stations. In one embodiment, robot 522 has one arm, and in another embodiment, robot 522 has two arms, where each arm has an end effector 524 to pick wafers such as wafer 526 for transport. Front-end robot 532, in atmospheric transfer module (ATM) 540, is used to transfer wafers 526 from cassette or Front Opening Unified Pod (FOUP) 534 in Load Port Module (LPM) 542 to airlock 530. Module center 528 inside processing modules 520a-520d is one location for placing wafer 526. Aligner 544 in ATM 540 is used to align wafers.

In an exemplary processing method, a wafer is placed in one of the FOUPs 534 in the LPM 542. Front-end robot 532 transfers the wafer from the FOUP 534 to an aligner 544, which allows the wafer 526 to be properly centered before it is etched or processed. After being aligned, the wafer 526 is moved by the front-end robot 532 into an airlock 530. Because the airlock 530 has the ability to match the environment between an ATM 540 and a VTM 538, the wafer 526 is able to move between the two pressure environments without being damaged. From the airlock 530, the wafer 526 is moved by robot 522 through VTM 538 and into one of the processing modules 520a-520d. In order to achieve this wafer movement, the robot 522 uses end effectors 524 on each of its arms. Once the wafer 526 has been processed, it is moved by robot 522 from the processing modules 520a-520d to the airlock 530. From here, the wafer 526 may be moved by the front-end robot 532 to one of the FOUPs 534 or to the aligner 544.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 11 may be implemented with the tool in FIG. 12. Machine-readable media containing instructions for controlling process operations in accordance with the present invention may be coupled to the system controller.

In some embodiments an apparatus is provided, where the apparatus includes a process chamber having a substrate holder configured for holding the semiconductor substrate during etching; a plasma generator configured for generating a plasma in a process gas; and a controller. The controller includes program instructions for implementing any of the methods describing herein.

In another aspect a non-transitory computer machine-readable medium is provided, where it includes code for causing the performance of any of the methods described herein.

In another aspect, a system for forming spacers or hardmasks on a semiconductor substrate is provided. The system includes one or more deposition chambers; one or more etch chambers; and a controller. The controller includes program instructions for implementing any methods described herein. In another aspect, the system includes any of the apparatuses and systems described herein and a stepper. In another aspect, a system for processing a semiconductor substrate is provided. In one embodiment the system includes: one or more deposition chambers; one or more etch chambers; and a system controller comprising program instructions for: (i) causing a deposition of a tin oxide layer over horizontal surfaces and sidewalls of a plurality of protruding features on the semiconductor substrate; (ii) causing a formation of a passivation layer on the tin oxide layer at the sidewalls of the protruding features, and (iii) causing a removal of the tin oxide layer from horizontal surfaces of the protruding features, without causing a removal of the tin oxide layer over the sidewalls of the protruding features.

Alternating Etch and Passivation Process

In some embodiments the etching of tin oxide in various semiconductor processing methods described herein is performed in a presence of exposed silicon-containing layers, such as amorphous silicon, SiOC, SiON, SiONC, SiN, SiC, and $SiO_2$. In some embodiments the silicon-containing layer is further protected from undesired etching that may occur during the tin oxide etch.

Figure 13:
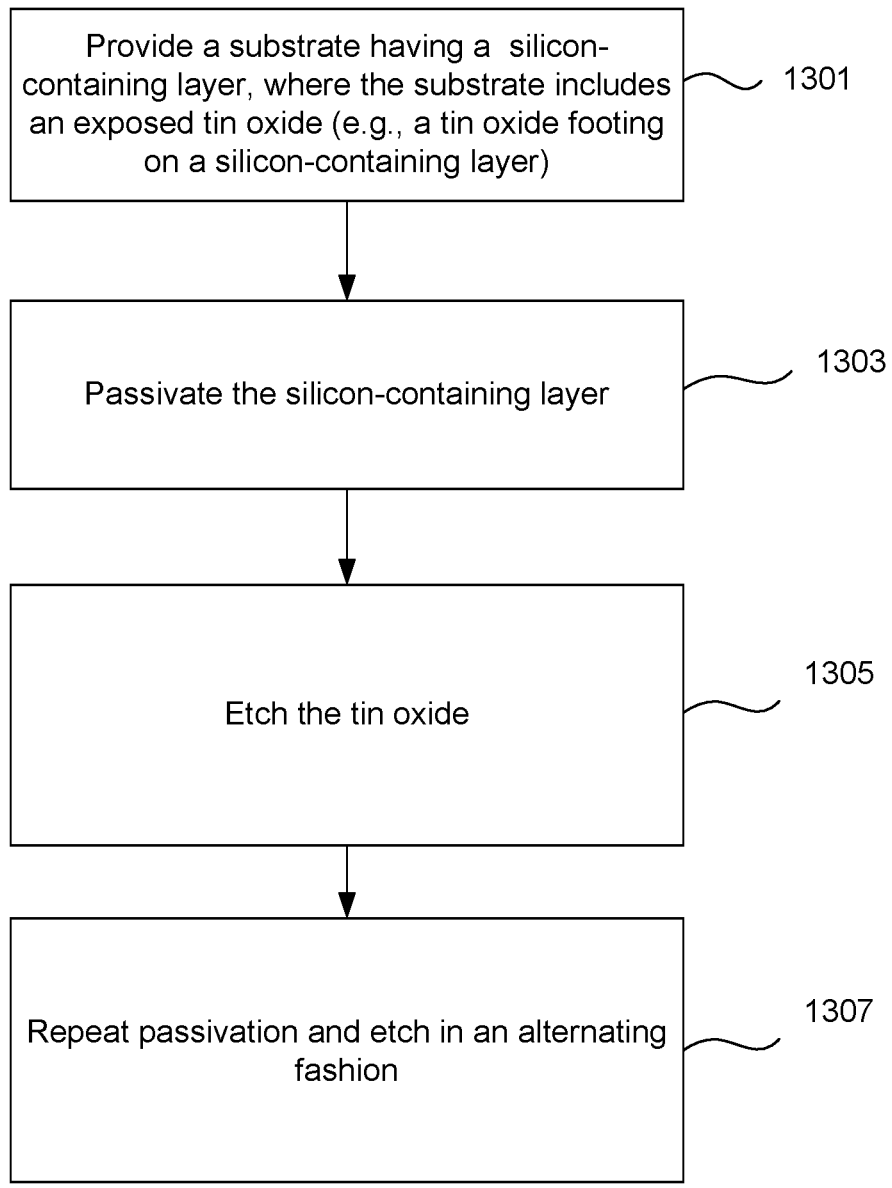
FIG. 13 is a process flow diagram for a method according to an embodiment provided herein.
Figure 14A:
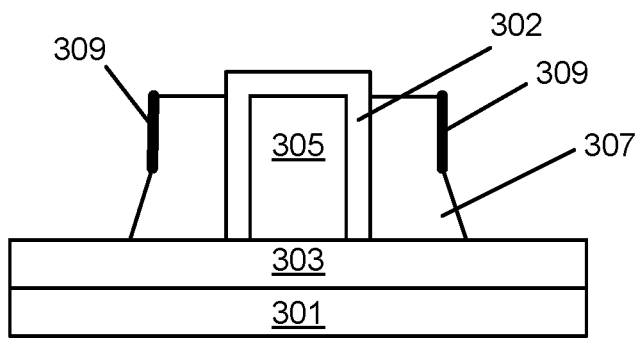
FIGS. 14A-14C show schematic cross-sectional views of a semiconductor substrate undergoing processing according to an embodiment provided herein.

An example of a process flow diagram that utilizes such protection is shown in FIG. 13. The process starts in 1301 by providing a substrate having a silicon-containing layer, where the substrate further includes an exposed tin oxide layer (e.g., a tin oxide footing on a silicon oxide layer). An example of such substrate is shown in FIG. 14A, which is identical to FIG. 3C. In FIG. 14A, the substrate includes a protruding feature 305 disposed on an etch stop layer 303. The etch stop layer in the illustrated embodiment is a silicon-containing layer, such as amorphous silicon, SiOC, SiON, SiONC, SiN, SiC, or $SiO_2$. The tin oxide layer 307 resides at the sidewalls of the protruding feature 305 and forms a footing (a lateral expansion at the bottom of the protruding feature), which needs to be reduced in order to form tin oxide spacers with consistent distance. While in some embodiments the footing can be efficiently removed as described with reference to FIG. 3D, in some cases etching of the footing can cause inadvertent etching of the etch stop layer 303. This inadvertent etching can occur, in one example if a chlorine-based etch chemistry (e.g., $Cl_2/BCl_3$ etch) is used during etch of tin oxide, and where the silicon-containing layer is SiOC.

Figure 14B:
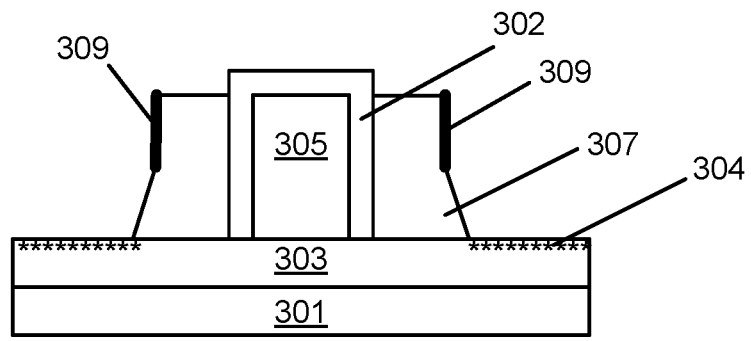

Referring to FIG. 13, in operation 1303, the silicon-containing layer is passivated. The passivation is a treatment that makes the silicon-containing layer more resistant to a tin oxide etch chemistry. In one example, passivation is performed by treating a substrate with an oxygen-containing reactant, such as by treating the substrate with an oxygen-containing reactant in a plasma. For example, plasma may be formed in a process gas that includes $O_2$, $O_3$, $SO_2$, $CO_2$, or any combination of these oxygen-containing reactants. In some embodiments the treatment results in formation of silicon-oxygen bonds at the outer exposed portion of the silicon-containing layer. For example, a SiOC layer may be made more oxygen-rich after the passivation treatment. In another example, a silicon oxide etch stop layer deposited by CVD, contains residual carbon and hydrogen, and passivation with an oxygen-containing reactant can reduce the content of carbon and hydrogen in the layer, and make it more resistant towards tin oxide etch chemistry. The substrate having a passivated etch stop layer 304 is shown in FIG. 14B. In another embodiment the passivation is performed by treating the substrate with a nitrogen containing reactant, such as with a nitrogen-containing reactant (e.g., $N_2$) in a plasma. The purpose of the passivation treatment is to make the silicon-containing material (e.g., etch stop layer material) more resistant to a tin oxide chemistry that is used for tin oxide etching, such as a chlorine-based etch chemistry, or a hydrogen-based etch chemistry.

Figure 14C:
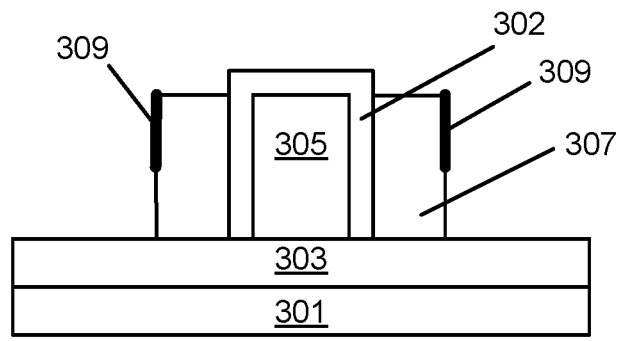

In operation 1305, tin oxide is etched. Tin oxide can be etched using any of the methods described herein, such as by exposing the substrate to a chlorine-based chemistry (e.g., $Cl_2$ and/or $BCl_3$ in a plasma), and/or a hydrogen-based chemistry (e.g., treatment with $H_2$, HBr, a hydrocarbon or a combination thereof, as described herein). The reactant gases (e.g., $Cl_2$ and/or $BCl_3$) may be provided together with an inert diluent gas, such as helium, argon, neon, or xenon. In operation 1307, the passivation step 1303 and the etching step 1305 are repeated in an alternating fashion. It is noted that the first passivation step may be performed before or after the first etching step. For example, the method may have an etch/passivation/etch/passivation sequence, or a passivation/etch/passivation/etch sequence. In some embodiments the method involves between 2-50, such as between 5-20 etch and passivation steps (i.e. each of etch and passivation steps is performed between 2-50, such as between 5-20 steps). The structure obtained after the required number of etching and passivation is illustrated in FIG. 14C. In one specific example each etching step is performed for about 10 seconds and each passivation step is performed for 5 seconds, where the method involves performing between 8-20 of each of the steps in an alternating fashion.

The alternating etching and passivation sequence described herein can provide several advantages. First, undesired etching of the silicon-containing etch stop layer can be minimized, while sidewall thickness can be retained. Further, the footing can be efficiently removed. It is noted that the method described herein can be used for protecting any silicon-containing layer during etching of exposed tin oxide, but is particularly useful for removing tin oxide footing as described with reference to FIGS. 14A-14C. It is noted that silicon oxide is generally more resistant to etching than other silicon-containing materials, and provided methods are particularly useful for protecting such materials as SiOC, amorphous silicon, SiOCN, and SiC, although these methods can also be used for passivation of silicon oxide. In one specific implementation the substrate containing such materials is passivated using an oxygen-containing reactant (e.g., $O_2$, $O_3$, $SO_2$, or $CO_2$ in a plasma), which makes the silicon-containing material more resistant to a chlorine-based tin oxide etch chemistry (e.g., $Cl_2/BCl_3$ chemistry) and hydrogen-based tin oxide etch chemistry (e.g., $H_2$, HBr, hydrocarbon, etch). Therefore, in some embodiments the process involves alternating passivation with an oxygen-containing reactant and tin oxide etching using a chlorine-based chemistry and/or a hydrogen-based chemistry as described herein.

In one example it was possible to decrease tin oxide sidewall loss from 5 nm to less than 1 nm when provided method was implemented and to decrease bottom SiOC layer loss from 5 nm to 1 nm. The tin oxide footing was decreased from 6 nm to 1 nm by implementing these methods. It is noted that provided methods can be implemented with or without use of tin oxide passivation layer 309.

In one example, a substrate containing an exposed amorphous silicon etch stop layer and an exposed tin oxide layer (during formation of tin oxide spacer) was passivated to make the amorphous silicon etch stop layer more resistant to tin oxide etch chemistry. Passivation was conducted at 40 degrees C., and 5 mTorr by exposing the substrate to a plasma formed in a process gas that consisted of $O_2$ (provided at 200 sccm). The plasma was formed using 13.56 MHz RF frequency and 400 W power per one 300 mm substrate. After passivation, the process chamber was purged with argon, and tin oxide was etched at 40 degrees C., and 10 mTorr by exposing the substrate to a plasma formed in a process gas that consisted of 10 sccm $BCl_3$ (provided at 10 sccm), 190 sccm $Cl_2$ (provided at 190 sccm) and helium (provided at 200 sccm). The plasma was formed using 13.56 MHz RF frequency and 400 W power per one 300 mm substrate. The process chamber was then purged and the passivation and etch steps (each followed by purging) were repeated in an alternating fashion until the spacer footing of tin oxide was removed.

In another aspect, an apparatus is provided (e.g., any of the etching tools described herein), where the apparatus includes: (a) a processing chamber having a support for the semiconductor substrate and an inlet for introduction of one or more reactants into the processing chamber; and (b) a controller comprising program instructions for: (i) causing passivation a silicon-containing layer on a semiconductor substrate towards a tin oxide etch chemistry; (ii) causing etching of a tin oxide on a semiconductor substrate; and (iii) causing a repeating, in an alternating fashion of (i) and (ii). The controller may be further programmed to perform any of the methods described herein.

FURTHER IMPLEMENTATIONS

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

What is claimed is:
1. A method of processing a semiconductor substrate, the method comprising:
   (a) providing a semiconductor substrate having an exposed silicon-containing material and an exposed tin oxide;
   (b) passivating the exposed silicon-containing material towards a tin oxide etch chemistry;
   (c) etching the exposed tin oxide using the tin oxide etch chemistry; and
   (d) repeating operations (b) and (c) such that operations (b) and (c) are performed in an alternating fashion.

2. The method of claim 1, wherein the exposed silicon-containing material is selected from the group consisting of amorphous silicon, silicon oxide, SiON, SiOC, SiONC, SiC, and SiN.

3. The method of claim 1, wherein (c) comprises etching tin oxide using a chlorine-based etch chemistry that comprises exposing the semiconductor substrate to a plasma-activated chlorine-containing reactant selected from the group consisting of $Cl_2$, $BCl_3$, and combinations thereof.

4. The method of claim 1, wherein (c) comprises etching the tin oxide using a hydrogen-based etch chemistry that results in a formation of a tin hydride.

5. The method of claim 1, wherein (c) comprises etching the tin oxide using a hydrogen-based etch chemistry, by contacting the semiconductor substrate with a plasma-activated hydrogen-containing reactant selected from the group consisting of $H_2$, HBr, $NH_3$, $H_2O$, a hydrocarbon, and combinations thereof.

6. The method of claim 1, wherein (c) comprises etching tin oxide using a chlorine-based etch chemistry that comprises exposing the semiconductor substrate to a plasma-activated process gas comprising a chlorine-containing reactant selected from the group consisting of $Cl_2$, $BCl_3$, and combinations thereof, and a diluent gas selected from the group consisting from helium, neon, argon, and xenon and combinations thereof.

7. The method of claim 1, wherein (b) comprises treating the substrate with an oxygen-containing reactant.

8. The method of claim 1, wherein (b) comprises treating the substrate with a plasma-activated oxygen-containing reactant.

9. The method of claim 1, wherein (b) comprises treating the substrate with a plasma formed in a process gas comprising a gas selected from the group consisting of $O_2$, $O_3$, $SO_2$, and $CO_2$.

10. The method of claim 1, wherein (b) is performed before (c).

11. The method of claim 1, wherein (c) is performed before (b).

12. The method of claim 1, wherein operations (b) and (c) are performed between 2-50 times.

13. The method of claim 1, wherein the silicon-containing material is selected from the group consisting of amorphous silicon, silicon oxide, SiON, SiOC, SiONC, SiC, and SiN, wherein the passivating in (b) comprises treating the substrate with a plasma-activated oxygen-containing reactant, and wherein (c) comprises etching the tin oxide using a chlorine-based etch chemistry that comprises exposing the semiconductor substrate to a plasma-activated chlorine-containing reactant selected from the group consisting of $Cl_2$, $BCl_3$, and combinations thereof.

14. The method of claim 1, wherein (b) comprises treating the semiconductor substrate with a nitrogen-containing reactant.

* * * * *